United States Patent
Fasoli et al.

(10) Patent No.: US 7,177,191 B2
(45) Date of Patent: Feb. 13, 2007

(54) INTEGRATED CIRCUIT INCLUDING MEMORY ARRAY INCORPORATING MULTIPLE TYPES OF NAND STRING STRUCTURES

(75) Inventors: Luca G. Fasoli, San Jose, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 67 days.

(21) Appl. No.: 11/026,492

(22) Filed: Dec. 30, 2004

(65) Prior Publication Data

US 2006/0146608 A1    Jul. 6, 2006

(51) Int. Cl.
  *G11C 11/34* (2006.01)
(52) U.S. Cl. ............... 365/185.17; 365/230.05
(58) Field of Classification Search ........... 365/185.17, 365/230.05
  See application file for complete search history.

(56) References Cited

U.S. PATENT DOCUMENTS

| | | | |
|---|---|---|---|
| 5,969,990 A | 10/1999 | Arase | |
| 6,034,882 A | 3/2000 | Johnson et al. | |
| 6,115,287 A | 9/2000 | Shimizu et al. | |
| 6,191,999 B1 | 2/2001 | Fujieda et al. | |
| 6,295,227 B1 | 9/2001 | Sakui et al. | |
| 6,370,081 B1 | 4/2002 | Sakui et al. | |
| 6,614,070 B1 | 9/2003 | Hirose et al. | |
| 6,856,572 B2 | 2/2005 | Scheuerlein et al. | |
| 6,859,410 B2 | 2/2005 | Scheuerlein et al. | |
| 6,876,569 B2 | 4/2005 | Itoh et al. | |
| 6,960,794 B2 | 11/2005 | Walker et al. | |
| 7,012,299 B2 | 3/2006 | Mahajani et al. | |
| 7,023,739 B2 * | 4/2006 | Chen et al. ............ | 365/185.28 |
| 2001/0055838 A1 | 12/2001 | Walker et al. | |
| 2003/0095448 A1 | 5/2003 | Ichige et al. | |
| 2003/0155582 A1 | 8/2003 | Mahajani et al. | |

(Continued)

FOREIGN PATENT DOCUMENTS

EP    0 395 886 A2    11/1990

(Continued)

OTHER PUBLICATIONS

Compardo, Giovanni, et al., "40-mm$^2$ 3-V-Only 50-MHz 64-Mb 2-b/cell CHE NOR Flash Memory," IEEE Journal of Solid-State Circuits, vol. 35, No. 11, Nov. 2000, pp. 1655-1667.

(Continued)

*Primary Examiner*—Michael Tran
(74) *Attorney, Agent, or Firm*—Zagorin O'Brien Graham LLP

(57) ABSTRACT

A monolithic integrated circuit includes a memory array having first and second groups of NAND strings, each NAND string comprising at least two series-connected devices and coupled at one end to an associated global array line. NAND strings of the first and second groups differ in at least one physical characteristic, such as the number of series-connected devices forming the NAND string, but both groups are disposed in a region of the memory array traversed by a plurality of global array lines. The memory array may include a three-dimensional memory array having more than one memory plane. Some of the NAND strings of the first group may be disposed on one memory plane, and some of the NAND strings of the second group may be disposed on another memory plane. In some cases, NAND strings of both groups may share global array lines.

29 Claims, 14 Drawing Sheets

U.S. PATENT DOCUMENTS

| | | |
|---|---|---|
| 2003/0202406 A1 | 10/2003 | Issa |
| 2003/0214835 A1 | 11/2003 | Nejad et al. |
| 2003/0227795 A1 | 12/2003 | Seyyedy et al. |
| 2003/0235063 A1 | 12/2003 | Van Brocklin et al. |
| 2004/0001348 A1 | 1/2004 | Vyvoda et al. |
| 2004/0057276 A1 | 3/2004 | Nejad et al. |
| 2004/0124466 A1 | 7/2004 | Walker et al. |
| 2004/0125629 A1 | 7/2004 | Scheuerlein et al. |
| 2004/0145024 A1* | 7/2004 | Chen et al. ............ 257/390 |
| 2004/0190360 A1 | 9/2004 | Scheuerlein |
| 2005/0018485 A1 | 1/2005 | Noguchi et al. |
| 2005/0056869 A1* | 3/2005 | Ichige et al. ............ 257/222 |
| 2005/0121790 A1 | 6/2005 | Cleeves et al. |
| 2005/0122779 A1* | 6/2005 | Fasoli et al. ............ 365/185.17 |
| 2005/0122780 A1* | 6/2005 | Chen et al. ............ 365/185.17 |
| 2005/0123837 A1 | 6/2005 | Chen et al. |
| 2005/0127519 A1 | 6/2005 | Scheuerlein et al. |
| 2005/0128807 A1* | 6/2005 | Chen et al. ............ 365/185.17 |
| 2005/0226049 A1 | 10/2005 | Jeong et al. |
| 2006/0145193 A1 | 7/2006 | So et al. |
| 2006/0146639 A1 | 7/2006 | Fasoli et al. |

OTHER PUBLICATIONS

Motta, Ilaria, et al., "High-Voltage Management in Single-Supply CHE NOR-Type Flash Memories," Proceedings of the IEEE, vol. 91, No. 4, Apr. 2003, pp. 554-568.

Okuda, Takashi and Murotani, Tatsunori, "A Four-Level Storage 4-Gb DRAM," IEEE Journal of Solid-State Circuits, vol. 32, No. 11, Nov. 1997, pp. 1743-1747.

Nishihara, Toshiyuki et al., "A Quasi-Matrix Ferroelectric Memory for Future Silicon Storage," IEEE Journal of Solid-State Circuits, vol. 37, No. 11, Nov. 2002, pp. 1479-1484.

* cited by examiner

SINGLE LAYER OF 2 TRANSISTOR STRINGS, AND ODD NUMBER OF 2T STRINGS PER LONG STRING

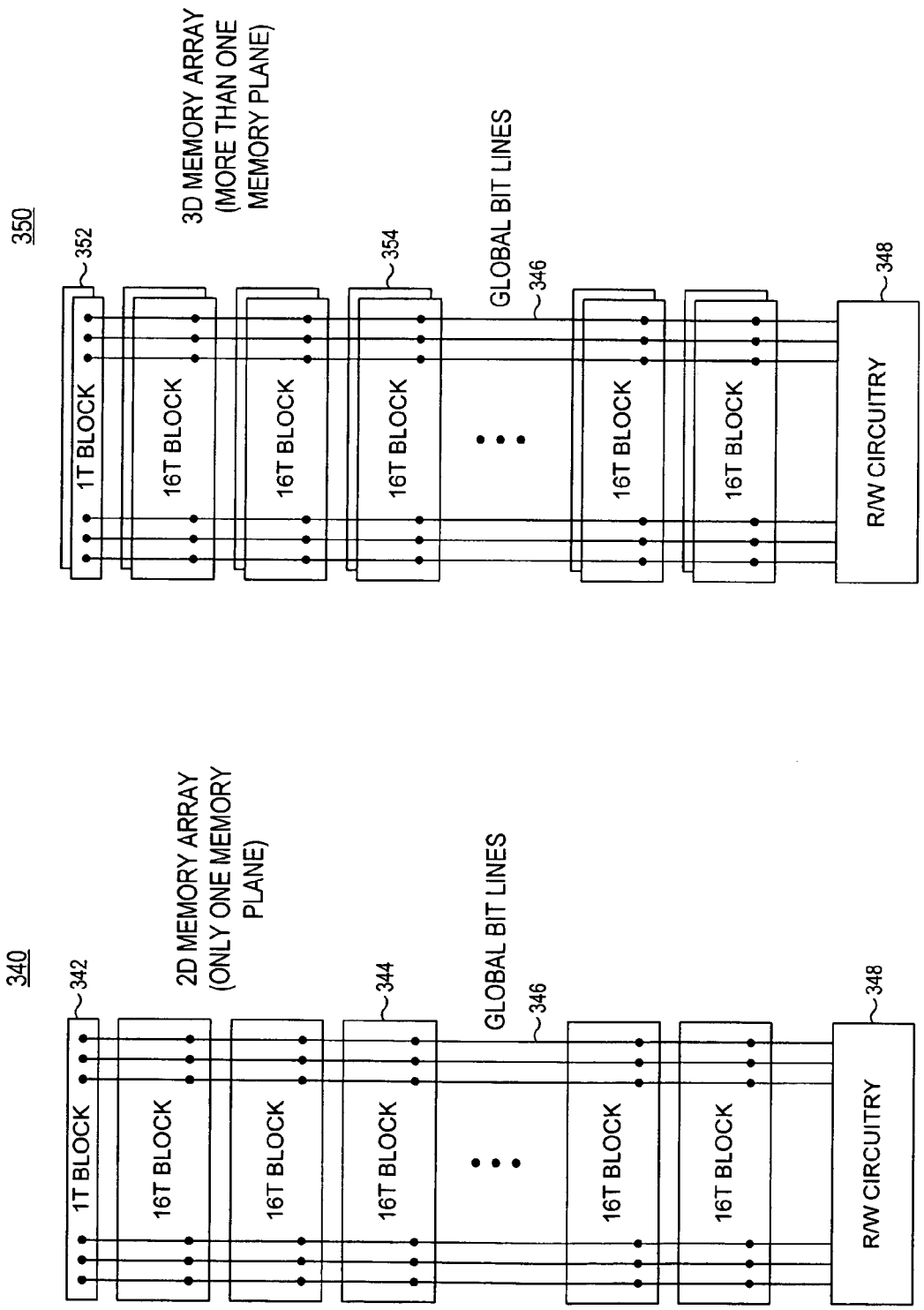

INTEGRATED CIRCUIT INCLUDING MEMORY ARRAY INCORPORATING MULTIPLE TYPES OF NAND STRING STRUCTURES

BACKGROUND

1. Field of the Invention

The present invention relates to semiconductor integrated circuits containing memory arrays, and in preferred embodiments the invention particularly relates to monolithic three-dimensional memory arrays having series-connected strings of memory cells.

2. Description of the Related Art

Recent developments in semiconductor processing technologies and memory cell technologies have continued to increase the density achieved in integrated circuit memory arrays. For example, certain passive element memory cell arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane or level of memory cells have been fabricated implementing such so-called $4F^2$ memory cells on each memory plane. Exemplary three-dimensional memory arrays are described in U.S. Pat. No. 6,034,882 to Johnson, et al., entitled "Vertically Stacked Field Programmable Nonvolatile Memory and Method of Fabrication."

A variety of other memory cell technologies and arrangements are also known. For example, NAND flash and NROM flash EEPROM memory arrays are known to achieve relatively small memory cells. Other small flash EEPROM cells are known which use hot electron programming, such as NROM and floating gate NOR flash memory arrays.

An extremely dense memory array may be achieved using a NAND-style arrangement, which includes series-connected NAND strings of memory cell devices. Each NAND string of memory cells may include a first block select device which couples one end of the NAND string to a global array line, a plurality of series-connected memory cells, and a second block select device which couples the other end of the NAND string to a bias node associated with the string. A memory array may include a number of memory blocks, with each block including a plurality of NAND strings which share the same word lines. Two block select signals for the block are typically routed to each NAND string of the block.

A basic NAND string is a very efficient structure, capable of achieving a $4F^2$ layout for the incremental transistor memory cell. Density is also improved because the block select lines may be routed in continuous polysilicon stripes across the array block, just like the word lines, without any provision being otherwise required for contacting a block select signal line to some but not all of the block select transistors formed in the NAND strings.

SUMMARY

In a memory array incorporating series-connected NAND strings of memory cell devices, the number of devices in a NAND strings plays an important role in determining many of the characteristics of the memory array. Longer strings (i.e., those strings having a greater number of memory cell devices) allow reaching very high densities, because the area overhead for any block select devices and the connections at each end of the NAND string is amortized over a greater number of memory cells within each string. However, other characteristics, such as cell current, read disturb, and program disturb, may degrade with increasing number of devices in a NAND string. For example, the bit line read current (i.e., the cell current) decreases with increasing number of devices in the NAND string (for a given voltage across the NAND string). In addition, the read disturb characteristics of a memory array, as well as the program disturb characteristics, also both degrade with longer NAND strings because each memory cell within a block of the array must ensure the voltage conditions of being unselected or half-selected a greater number of times while each of the other memory cells of the block is selected and read or programmed.

Certain applications may be better served by memories having different characteristics. For example, code storage may be better served by an array of reliable memory cells having a fast read time, while data storage may be adequately served by a memory array having more relaxed characteristics. As such, NOR arrays are sometimes used for code storage, and NAND arrays sometimes used for data storage. In other situations non-volatile arrays are used with SRAM to achieve desired characteristics.

The present invention provides a monolithic integrated circuit which includes a memory array having first and second groups of NAND strings, each NAND string comprising at least two series-connected devices and coupled at one end thereof to an associated global array line. NAND strings of the first group and the second group differ in at least one physical characteristic, and NAND strings of both the first and second group are disposed in a region of the memory array traversed by a plurality of global array lines. In some embodiments, NAND strings of the first group have a larger number of series-connected devices than NAND strings of the second group. In some embodiments, NAND strings of the first group have a different drive strength than NAND strings of the second group. In some embodiments, the memory array comprises a three-dimensional memory array having more than one memory plane, at least some of the NAND strings of the first group are disposed on at least a first memory plane, and at least some of the NAND strings of the second group are disposed on at least a second memory plane different than the first memory plane. Each NAND string may include a group of one or more memory cell devices in series with at least one select device.

In some embodiments, NAND strings on more than one memory plane share global array lines, and at least some of the NAND strings of both the first and second groups share global array lines. In various embodiments, the memory cell devices may be thin film devices including a charge storage dielectric, and the select devices at one or both ends of a NAND string may be substantially structurally identically to the memory cells. In certain embodiments, NAND strings of the first group are disposed on more than one plane, NAND strings of the second group are disposed on more than one plane, and NAND strings of both the first and second groups share global array lines.

In some embodiments, the invention provides an integrated circuit having a three-dimensional memory array that includes NAND strings having different number of memory cells in various strings. By exploiting a global bit line architecture, the read and write circuits may be shared between different types of NAND strings, thus improving the memory array efficiency. NAND strings with larger number of series devices provide a memory array having very high density, at the price of increased read and program disturb, and longer access time. In some embodiments, the longer strings may be used for data storage. NAND strings with fewer devices show improved read and program disturb, and shorter access time, and in some embodiments may be used for code or pointer storage. In addition, shorter NAND strings provide a smaller erase block size (i.e., determined by the number of series memory cells in an independently selectable NAND string), which can lead to greater flexibility for a user of such memory device. In some embodiments memory cells having a smaller erase block size may be advantageously used for pointer and file allocation table storage. In some embodiments, some or all of the array portion having shorter strings may also be used to store configuration information for internal purposes, such as redundancy information storage, thus avoiding the need for extra non-volatile bits for redundancy information. The shorter strings may be completely hidden from end user view, and may include configuration bits other than redundancy information.

Read and write circuits may be shared, or need not be shared. If achieving speed is important, the shorter strings can have its own optimized read path, but can still at least partially share the write path. In other embodiments, both paths can be completely separated. In some embodiments a memory array may include more than two types of strings on the same die. For example, an array may include a first group of 16T NAND strings (i.e., having 16 memory cell transistors), a second group of 4T NAND strings, and a third group of 1T NAND strings.

In an exemplary embodiment, an integrated circuit includes a three-dimensional memory array of thin film SONOS transistor NAND strings disposed on at least two memory planes formed above a substrate, and includes a higher density portion and a lower density portion. The higher density portion may be implemented as 16T NAND strings totaling 512 Mbits, and the lower density portion implemented as 1T NAND strings totaling 4 Mbits. Both high-density and lower density portions may share global bit lines, and also may share most or all of the read/write circuits. The 1T NAND strings provide erase blocks which are 1/16 as large as the 16T erase blocks, provide 1/16 the read disturb, exhibit virtually no $V_{PASS}$ program disturb, and provide roughly more than 10 times the read current, as compared to the 16T blocks. This allows a higher number of reads without degradation effects and can provide faster read times.

The invention in several aspects is suitable for integrated circuits having a memory array, for methods for operating such integrated circuits and memory arrays, and for computer readable media encodings of such integrated circuits or memory arrays, all as described herein in greater detail and as set forth in the appended claims.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 11 depicts a two-dimensional memory array (i.e., having a single memory plane) including a plurality of global bit lines traversing across and coupled to a respective NAND string in each of several blocks, including a plurality of 16T blocks and a single 1T block.

FIG. 12 depicts a three-dimensional memory array (i.e., having more than one memory plane) including a plurality of global bit lines traversing across and coupled to a respective NAND string in each of several blocks, including a plurality of 16T blocks and a single 1T block on each of at least two memory planes.

The use of the same reference symbols in different drawings indicates similar or identical items.

DESCRIPTION OF THE PREFERRED EMBODIMENT(S)

Figure 1:
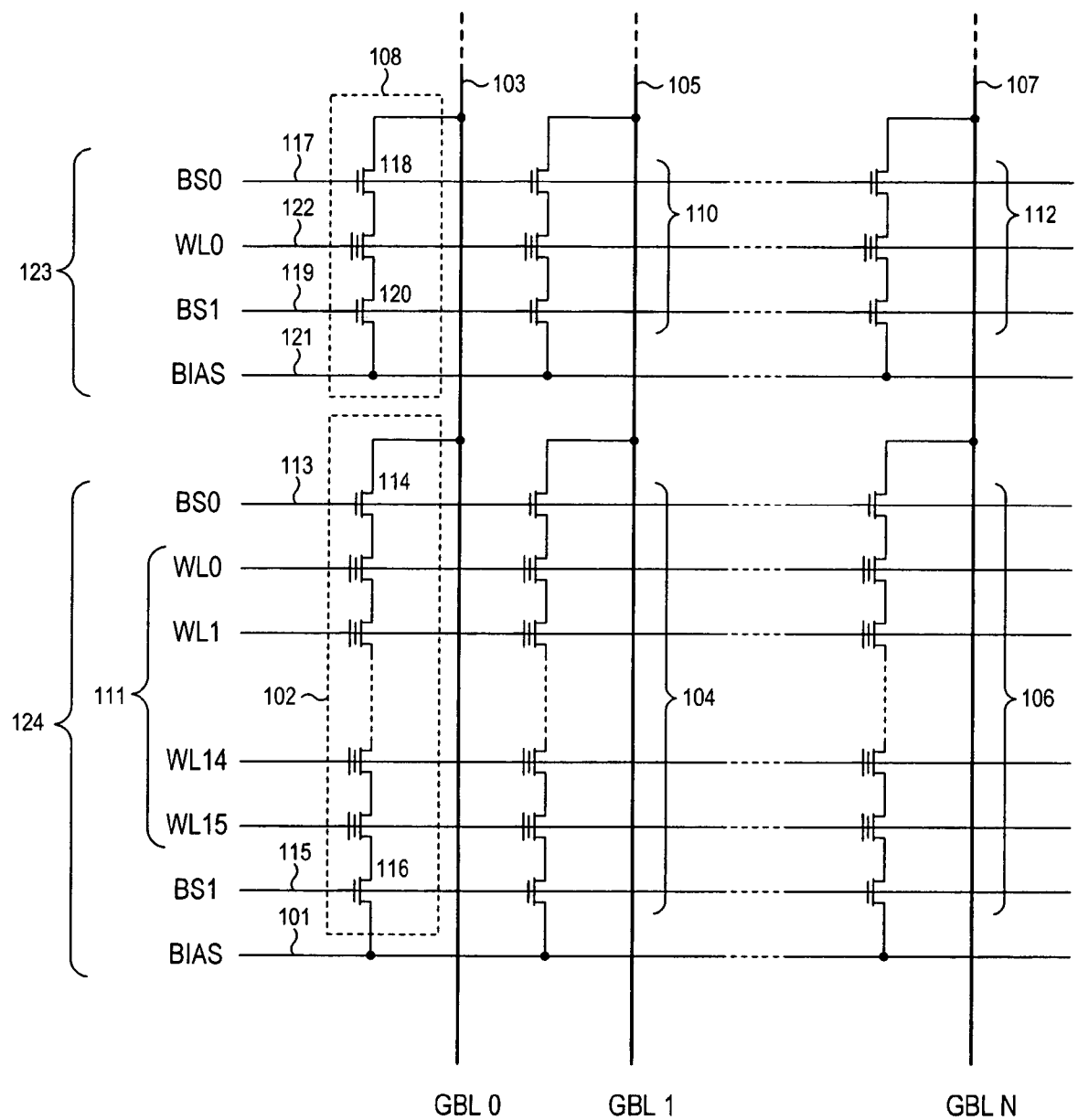
FIG. 1 depicts a portion of a non-mirrored NAND string memory array configuration in accordance with certain embodiments of the present invention.

Referring now to FIG. 1, a schematic diagram is shown representing a portion of an exemplary memory array 100. The portion shown may represent a two-dimensional array having only one plane of memory cells, or may represent one level of three-dimensional memory array having more than one level (i.e., more than one plane) of memory cells. Series-connected NAND strings 102, 104, 106 each includes sixteen memory cell transistors connected in series, each gated by a respective one of a plurality of sixteen word lines 111 (individually labeled WL0, WL1, ..., WL14, WL15). The NAND string 102 also includes a block select device 114 for coupling one end of the NAND string to a global bit line 103 (also labeled GBL0) in accordance with a block select signal BS0 conveyed on node 113, and further includes a second block select device 116 for coupling the other end of the NAND string to a shared bias node 101 in accordance with a block select signal BS1 conveyed on node 115.

Each NAND string 102, 104, 106 is disposed within the same block 124 within the memory array, and each is respectively coupled to its associated global bit line 103, 105, 107. Such global bit lines may be conveyed by a wiring level below the array, or alternatively above the array, or alternatively on a wiring level within the array (e.g., in a three-dimensional array having more than one level). The NAND strings 102, 104, 106 may be referred to as "adjacent" NAND strings, as they share the same word lines (i.e., within the same block of the array), even though they do not share global bit lines. For the arrangement shown, the shared bias node 101 may also be known as a global source line and may also be known as a shared "drain" line or "drain bias" line.

NAND strings 108, 110, 112 each includes one memory cell transistor gated by a word line WL0 conveyed on node 122. The 1T NAND string 108 also includes a block select device 118 for coupling one end of the NAND string to the global bit line 103 in accordance with a block select signal BS0 conveyed on node 117, and further includes a second block select device 120 for coupling the other end of the NAND string to a shared bias node 121 in accordance with a block select signal BS1 conveyed on node 119. Each NAND string 108, 110, 112 are disposed within the same block 123 within the memory array, and each is respectively coupled to its associated global bit line 103, 105, 107.

The respective block select signals BS0 and BS1, the respective word lines, and the respective global source line for each of the two memory blocks all traverse across the memory array in the same direction (for convenience, here shown as horizontally), so that they may be more conveniently decoded and driven to appropriate levels. The global bit lines 103, 105, 107 traverse across the memory array generally in an orthogonal direction (for convenience, here shown as vertically).

The memory cells in the NAND strings (i.e., those gated by one of the word lines) are preferably SONOS-type structures. As used herein, the term SONOS is used broadly and is meant to refer to the general class of transistor devices having a charge storage dielectric layer between the gate and the underlying channel, and is not used in a restrictive sense to merely imply a literal silicon-oxide-nitride-oxide-silicon layer stack. For example, other kinds of charge storage dielectric layers may be employed, such as oxynitrides or silicon nano-particle dielectrics, as well as other kinds of memory cell structures, as described in greater detail hereebelow.

In the figure, the various block select devices (e.g., 118, 120, 114, 116) are shown as normal MOS devices without a charge storage dielectric. This would add some amount of additional process complexity but would allow better optimizing the select devices for lower leakage. However, another factor contributing to the efficiency of this array structure is the ability of the block select devices to be fabricated identically to the memory cell devices. In other words, the block select devices may be SONOS devices just like the memory cell devices. In 3D array embodiments having more than one memory level formed above a semiconductor substrate, each memory level could consequently include only one type of device, further simplifying the fabrication of each level. The block select devices may be sized identically to the memory cell devices, but in certain embodiments may have a longer channel length (i.e., wider polysilicon stripe for the block select signals) to increase the breakdown voltage of the block select devices.

In a preferred embodiment, the memory cell devices and block select devices are both SONOS devices which are implanted to shift the thermal equilibrium (i.e., minimum trapped negative charge in the nitride) threshold voltage $V_T$ to depletion mode. A depletion mode implant that is a slow diffuser, preferably antimony or arsenic, is preferably used because of the relatively higher diffusion of such dopants in a polycrystalline layer compared with a crystalline substrate, and also due to the extremely small dimensions of the devices. The erased state $V_T$ is substantially depletion mode, preferably −2V to −3V threshold, while the programmed state $V_T$ is preferably about zero volts. The memory cells are programmed or erased to one of the two threshold voltages according to the data state, but the block select devices are preferably programmed to have about a one-volt threshold voltage and maintained in this programmed state. Suitable fabrication methods are described in "Method for Fabricating Programmable Memory Array Structures Incorporating Series-Connected Transistor Strings" by Andrew J. Walker, et al., U.S. application Ser. No. 10/335,089 filed on Dec. 31, 2002, which application is hereby incorporated by reference in its entirety. Suitable biasing methods for reading and writing the memory cells with such NAND strings, including the implications of read and program disturb, are described in greater detail in "Programmable Memory Array Structure Incorporating Series-Connected Transistor Strings and Methods for Fabrication and Operation of Same" by Roy E. Scheuerlein, et al., U.S. application Ser. No. 10/335, 078 filed on Dec. 31, 2002, and in "NAND Memory Array Incorporating Capacitance Boosting of Channel Regions in Unselected Memory Cells and Method for Operation of Same" by En-Hsing Chen, et al., U.S. application Ser. No. 10/729,831 filed on Dec. 5, 2003, the disclosures of which are hereby incorporated by reference in their entirety.

Figure 2:
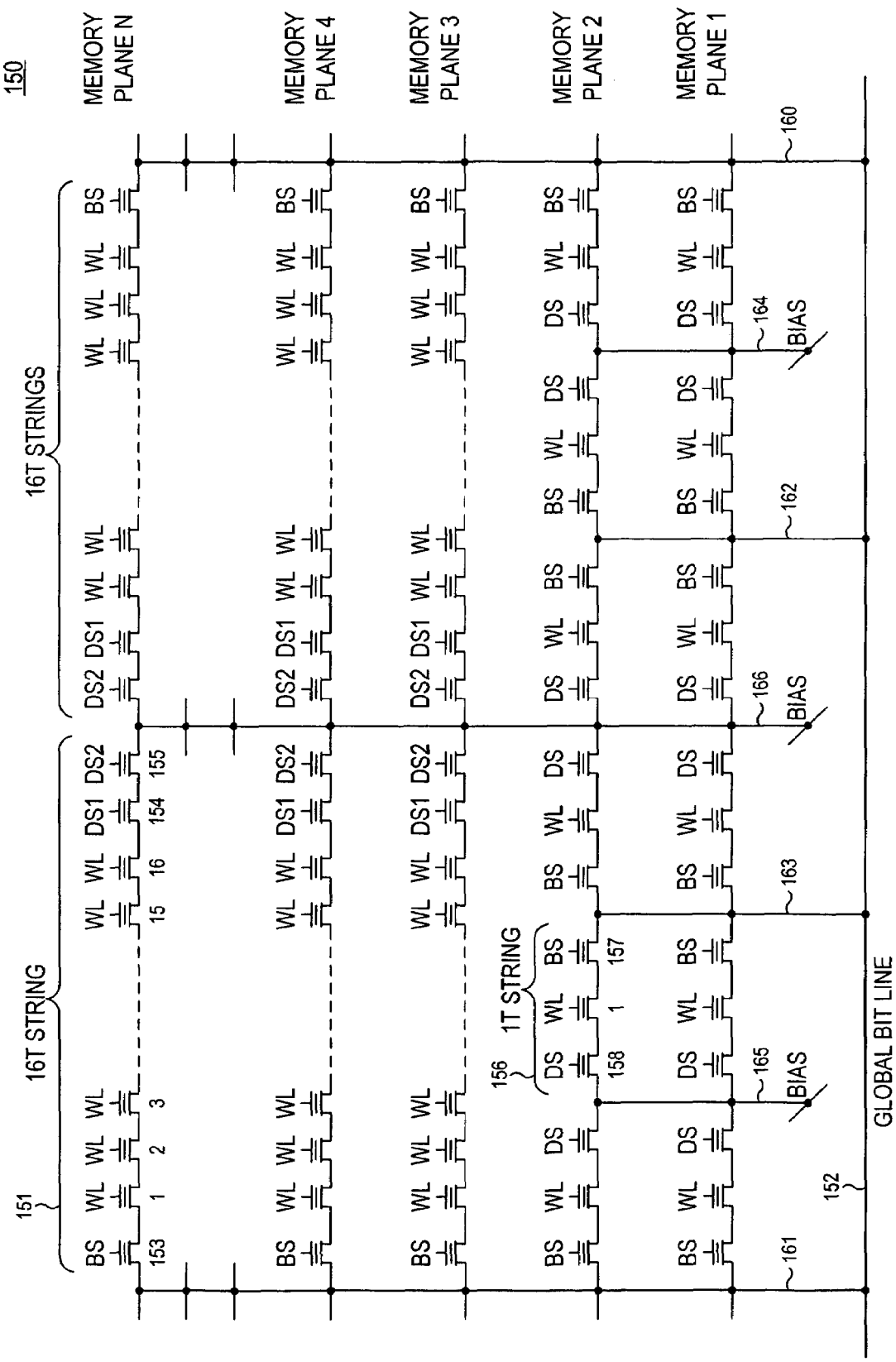
FIG. 2 depicts a portion of a NAND string memory array configuration in which 1T strings are disposed on each of the first two memory planes, and 16T strings are disposed on each of several upper memory planes.

The present invention contemplates a great number of memory array configurations incorporating NAND strings of a first group differing in at least one physical characteristic from NAND strings of a second group (i.e., colloquially, having at least two types of NAND strings). Referring now to FIG. 2, a schematic diagram is shown representing a portion of a three-dimensional memory array 150 in which 1T strings are disposed on each of two memory planes, and longer 16T strings are disposed on each of several other memory planes. One of the longer 16T strings is labeled 151, and shows 16 memory cell transistors each coupled to a respective word line WL, a single block select transistor 153 coupling the string 151 to a global bit line 152 by way of a vertical connection 161 shared by other NAND strings on other planes, and a pair of block select devices 154, 155 coupling the other end of the NAND string 151 to a bias node by way of a shared vertical connection 166. The block select devices 153, 154, 155 are shown here as charge storage devices like the memory cell devices. For convenience of description, the block select device coupling each 16T NAND string to the global bit line 152 is driven by a block select signal labeled BS, while the block select devices coupling each 16T NAND string to the bias line are driven respectively by drain select signals labeled DS1 and DS2. It should be appreciated that the BS, DS1, and DS2 signals associated with a given NAND string are unique signals shared with other NAND strings within the same memory block (i.e., sharing the same word lines), but are not common with the respective identically-labeled signals for other memory blocks. Similarly, it should also be appreciated that the word lines associated with a given NAND string, each of which is labeled WL, are nonetheless unique signals shared with other NAND strings within the same memory block, but are not common with the respective identically-labeled signals for other memory blocks, nor are the various word lines within a NAND string common to each other.

One of the shorter 1T strings is labeled 156, and shows 1 memory cell transistor coupled to a respective word line WL, a single block select transistor 157 coupling the string 156 to the global bit line 152 by way of a vertical connection 163 shared by other 1T NAND strings on memory plane 1 and memory plane 2, and a drain select device 158 coupling the other end of the NAND string 156 to a bias node by way of a shared vertical connection 165. For convenience of description, the block select device coupling each 1T NAND string to the global bit line 152 is driven by a select signal labeled BS, while the block select device coupling each 1T NAND string to a bias line are driven by drain select signal labeled DS. As before, it should be appreciated that the BS and DS signals associated with a given 1T NAND string are unique signals shared with other 1T NAND strings within the same memory block (i.e., sharing the same word lines), but are not common with the respective identically-labeled signals for other memory blocks.

The shared vertical connections 160, 161 are shared by NAND strings on each memory plane, but since the shorter 1T NAND string are disposed on the lower two memory planes (i.e., memory plane 1 and memory plane 2), and since three of the shorter 1T NAND strings are disposed beneath a single longer 16T NAND string on memory plane 3, additional shared vertical connections 162, 163 are provided for coupling the additional 1T NAND strings to the global bit line 152. Similarly, the vertical connection 166 is shared by NAND strings on each memory plane to couple each NAND string to a bias node, but additional shared vertical connections 164, 165 are provided for coupling the additional 1T NAND strings to bias nodes. In the exemplary structure shown an odd number of shorter 1T NAND strings are disposed beneath a single longer NAND string, and is particularly efficient because the shared vertical connections 161, 166 at the end of each longer string may also be shared by the 1T strings on the lower memory planes.

Figure 3:
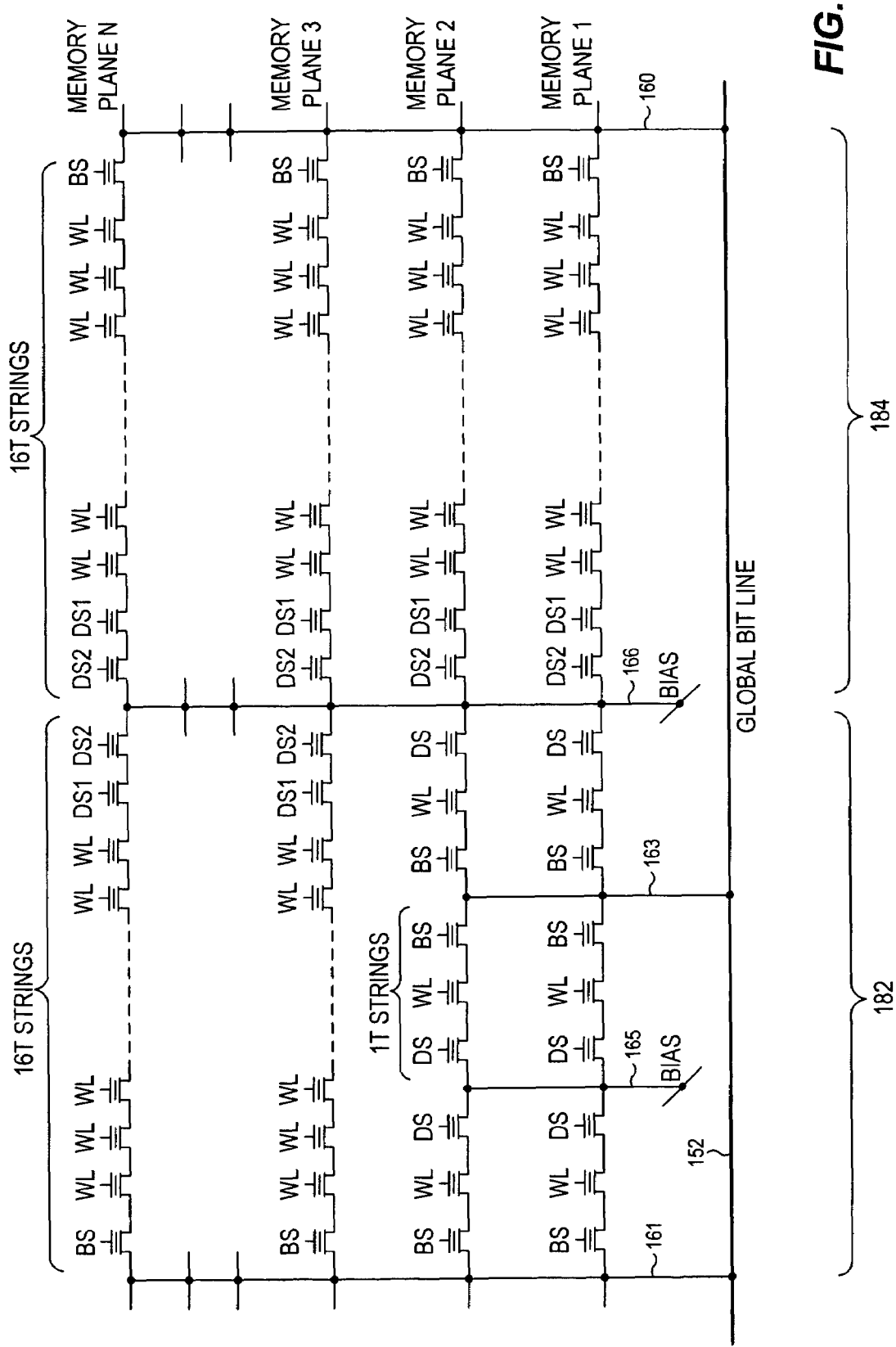
FIG. 3 depicts a portion of a NAND string memory array configuration showing a first portion of the array in which 1T strings comprise the first two memory planes, and 16T strings comprise upper memory planes, and a second portion of the array having 16T strings on all memory planes.

In another embodiment shown in FIG. 3, a portion of a three-dimensional memory array 180 is shown in which, within a region 182, 1T strings are disposed on each of two memory planes beneath 16T strings disposed on each of several upper memory planes (i.e., as is shown in FIG. 2), but also in which, within a region 184, additional 16T strings are disposed on each of the memory planes (i.e., Memory Plane 1, Memory Plane 2, Memory Plane 3, . . . , Memory Plane N). This configuration is one of many such configurations having NAND strings of a first group disposed on more than one memory plane, having NAND strings of a second group disposed on more than one memory plane, and having NAND strings of both the first and second groups sharing global array lines.

Figure 4:
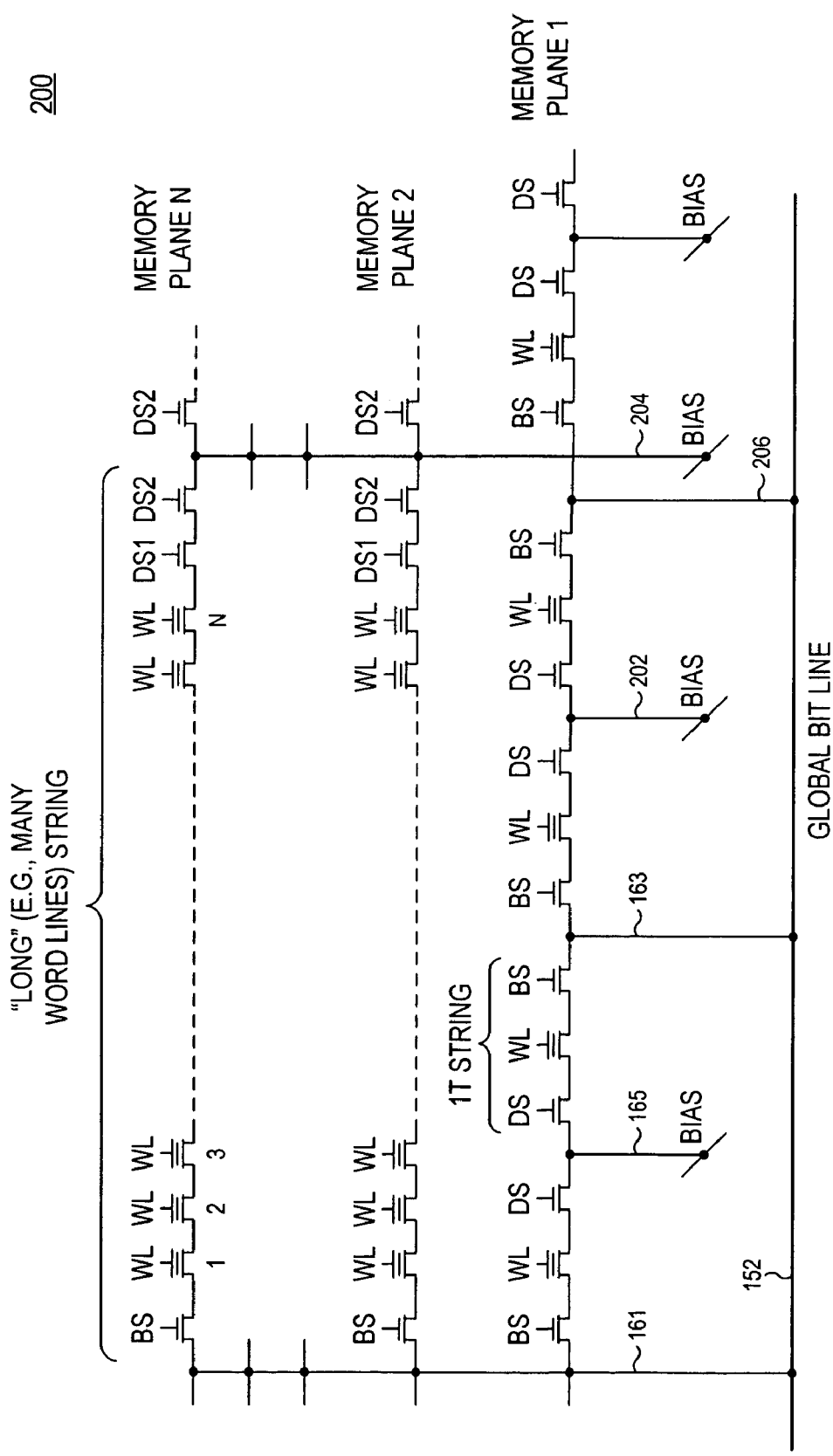
FIG. 4 depicts a portion of a NAND string memory array configuration in which four 1T strings are disposed on each of the first two memory planes below a longer NAND string on each of the upper memory planes.

In another embodiment shown in FIG. 4, a portion of a three-dimensional memory array 200 is shown in which 1T strings are disposed on one memory plane beneath longer strings disposed on each of several upper memory planes. Here, an even number of shorter 1T NAND strings (e.g., 4) are disposed beneath a single longer NAND string on the upper memory planes, and thus a vertical connection 204 is provided to couple the longer NAND strings to the bias node, while a separate vertical connection 206 is provided to couple a pair of back-to-back 1T NAND strings to the global bit line 152. Another vertical connection 202 is also provided to couple a pair of 1T NAND strings to their associated bias node. In this exemplary embodiment, the various block select and drain select devices are shown as regular transistors (i.e., without a storage dielectric). In some other embodiments, the vertical connection 204 may connect to a bias node on a wiring layer above the memory planes (not shown).

Figure 5:
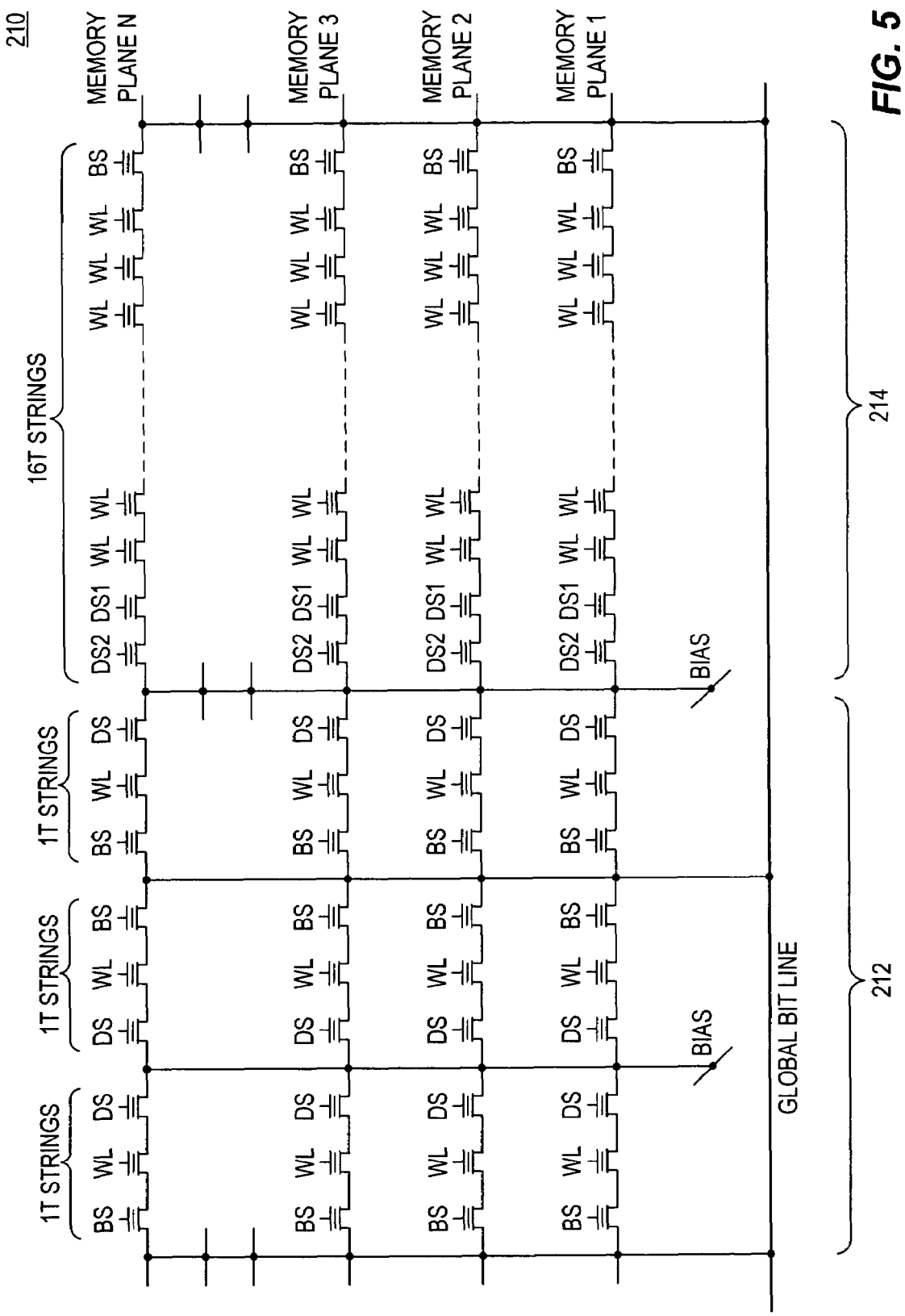
FIG. 5 depicts a portion of a NAND string memory array configuration in which, on each memory plane, several blocks of short 1T strings are disposed laterally displaced from a block of longer NAND strings.

In another embodiment shown in FIG. 5, a portion of a three-dimensional memory array 210 is shown in which, within a region 212, 1T strings are disposed on each of the memory planes, and in which, within a region 214, 16T strings are disposed on each of the memory planes. This configuration is one of many such configurations having NAND strings of a first group disposed on more than one memory plane, having NAND strings of a second group disposed on more than one memory plane, and having NAND strings of both the first and second groups sharing global array lines. In addition, this configuration is but one of many such configurations having NAND strings of one type on a first memory plane sharing a global bit line with a NAND string of a second type on a second memory plane.

Figure 6:
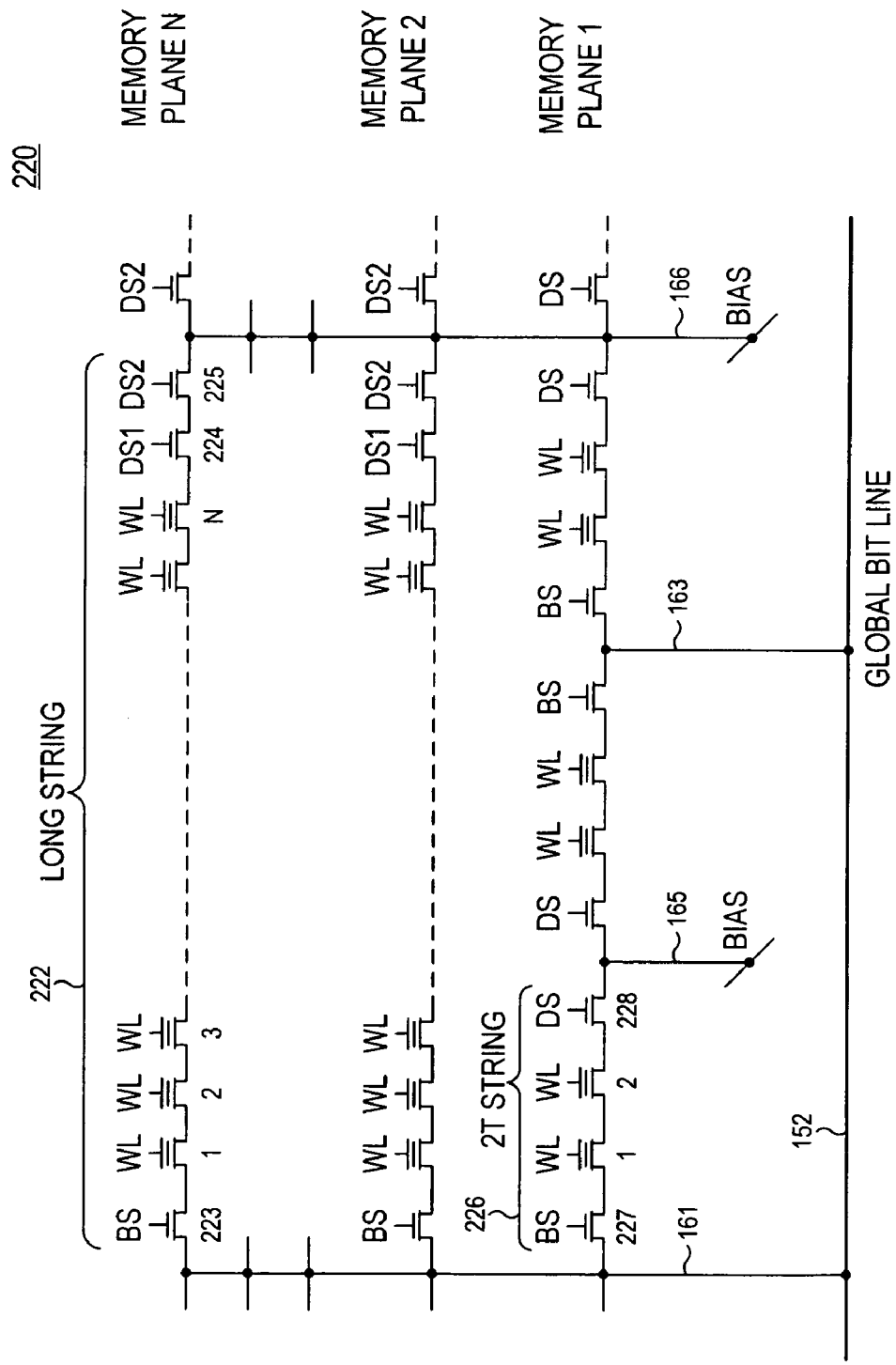
FIG. 6 depicts a portion of a NAND string memory array configuration in which 2T strings are disposed on one memory plane, and longer NAND strings are disposed on each of several other memory planes.

Referring now to FIG. 6, a schematic diagram is shown representing a portion of a three-dimensional memory array 220 in which shorter (e.g., 2T) strings are disposed on one (e.g., the lower-most) memory plane, and longer NAND strings are disposed on each of several other (e.g., upper) memory planes. One of the longer strings is labeled 222, and shows N memory cell transistors each coupled to a respective word line WL, a single block select transistor 223 coupling the string 222 to a global bit line 152 by way of a vertical connection 161 shared by other NAND strings on other planes, and a pair of drain select devices 224, 225 coupling the other end of the NAND string 222 to a bias node by way of a shared vertical connection 166. The select devices 223, 224, 225 are shown as non-charge storage devices, whereas the memory cell devices are shown as charge storage devices.

One of the shorter 2T strings is labeled 226, and shows 2 memory cell transistors coupled to a respective word line WL, a single block select transistor 227 coupling the string 226 to the global bit line 152 by way of the shared vertical connection 161, and a drain select device 228 coupling the other end of the NAND string 226 to a bias node by way of a shared vertical connection 165. As before, it should be appreciated that the BS and DS signals (e.g., DS, DS1, DS2) associated with a given NAND string are unique signals shared with other NAND strings within the same memory block (i.e., sharing the same word lines), but are not common with the respective identically-labeled signals for other memory blocks.

The shared vertical connections 161, 166 are shared by NAND strings on each memory plane, but an additional shared vertical connection 163 is provided for coupling a pair of back-to-back 2T NAND strings to the global bit line 152, and an additional shared vertical connection 165 is provided for coupling a pair of back-to-back 2T NAND strings to its associated bias node. In the exemplary structure shown an odd number of shorter 2T NAND strings are disposed beneath a single longer NAND string, and allows the shared vertical connections 161, 166 at the end of each longer string to also be shared by the 2T strings on the first memory plane.

Figure 7:
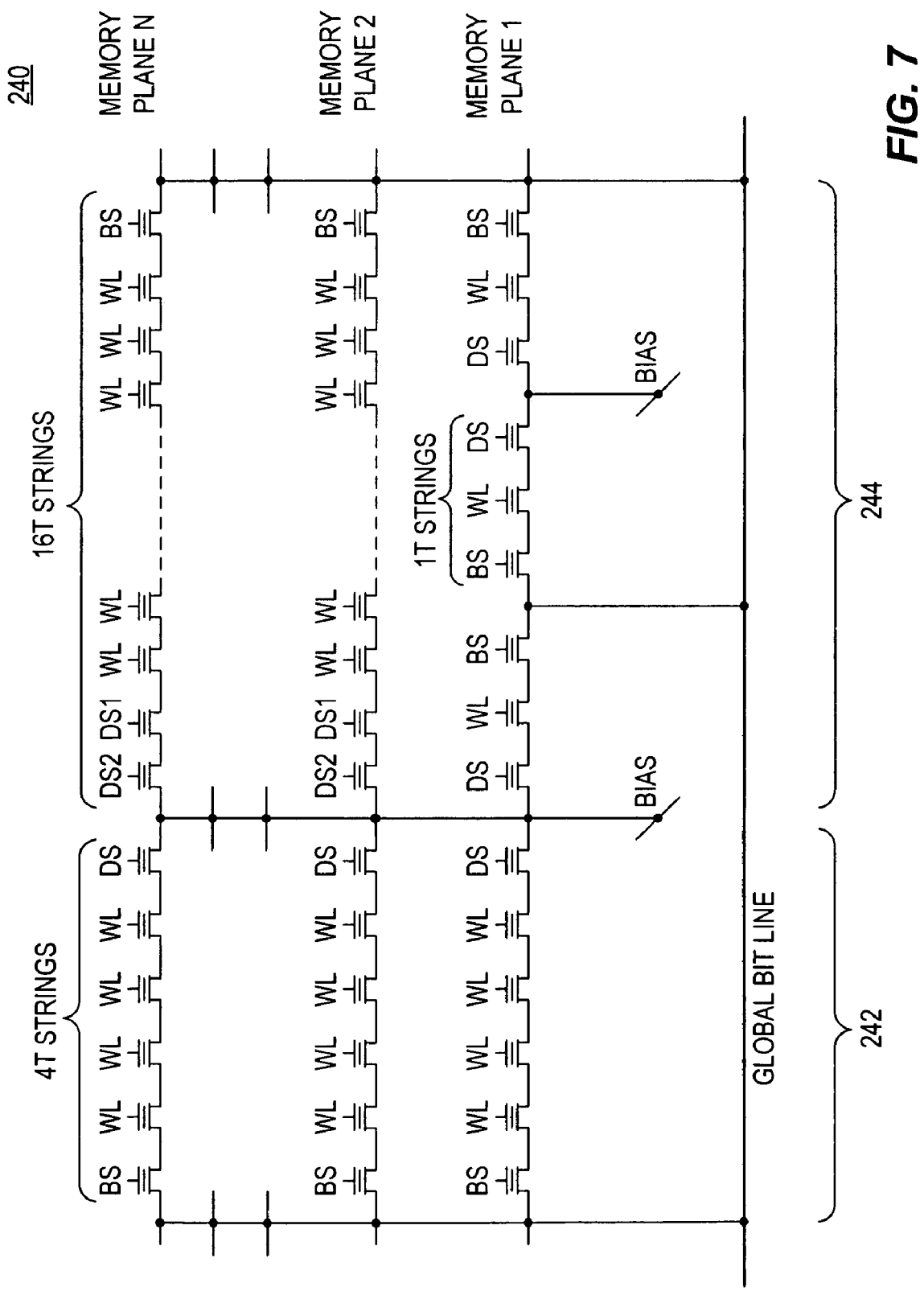
FIG. 7 depicts a portion of a NAND string memory array configuration showing in a first region 1T strings disposed on one memory plane, and longer NAND strings disposed on each of several other memory planes, while showing in a second region a 4T NAND string disposed on each memory plane.

In another embodiment shown in FIG. 7, a portion of a three-dimensional memory array 240 is shown in which, within a region 242, 4T strings are disposed on each of the memory planes, and in which, within a region 244, 1T strings are disposed on the first memory plane beneath 16T strings disposed on the upper memory planes. This configuration is one of many such configurations having NAND strings of at least three different types (e.g., 1T, 4T, and 16T strings). Moreover, this configuration is one of many such configurations having NAND strings of at least two different types on at least one memory plane (e.g., 1T and 4T strings on memory plane 1; 4T and 16T strings on memory plane 2). Also, this configuration is one of many such configurations having NAND strings of different types on different memory planes (e.g., 1T strings on memory plane 1 and 16T strings on memory plane 2; 4T strings on memory plane 1 and 16T strings on memory plane 2). In addition, this configuration is one of many such configurations having NAND strings of one type on a first memory plane sharing a global bit line with a NAND string of a second type on a second memory plane (e.g., 4T strings on memory plane 1 and 16T strings on memory plane 2; 4T strings on memory plane 2 and 1T strings on memory plane 1; 1T strings on memory plane 1 and 16T strings on memory plane 2).

Figure 8:
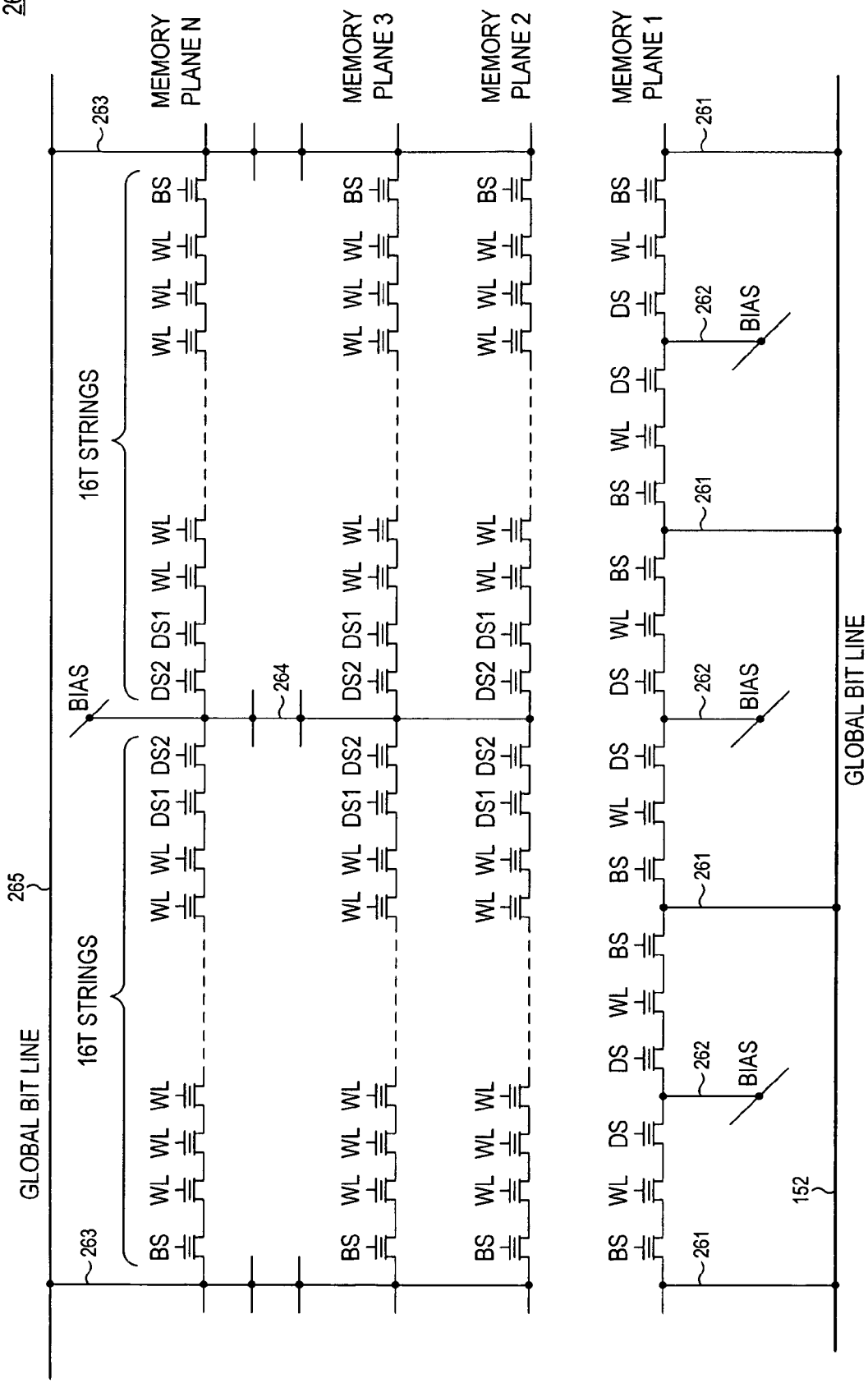
FIG. 8 depicts a portion of a NAND string memory array configuration in which three 1T strings are disposed on one memory plane below a longer NAND string disposed on each of the upper memory planes. The longer NAND strings on the upper planes are served by global bit line layer disposed above the memory planes, while a global bit line layer disposed below the lowermost memory plane serves the shorter 1T NAND strings.

In another embodiment shown in FIG. 8, a portion of a three-dimensional memory array 260 is shown in which 1T strings are disposed on one (e.g., the lower-most) memory plane beneath 16T strings disposed on the upper memory planes. However, each type of NAND string is served by separate global bit lines and bias lines. The shorter 1T NAND strings on memory plane 1 are coupled by vertical connections 261 to a global bit line 152 on a first global bit line layer disposed below the memory planes, and coupled by vertical connections 262 to associated bias lines. The longer 16T NAND strings on memory plane 2 through memory plane N are coupled by vertical connections 263 to a global bit line 265 on a second global bit line layer disposed above the memory planes, and coupled by vertical connections 264 to associated bias lines. Even though the two types of NAND strings do not share global bit lines, NAND strings of both types are nonetheless disposed in a region traversed by a plurality of global bit lines.

Figure 9:
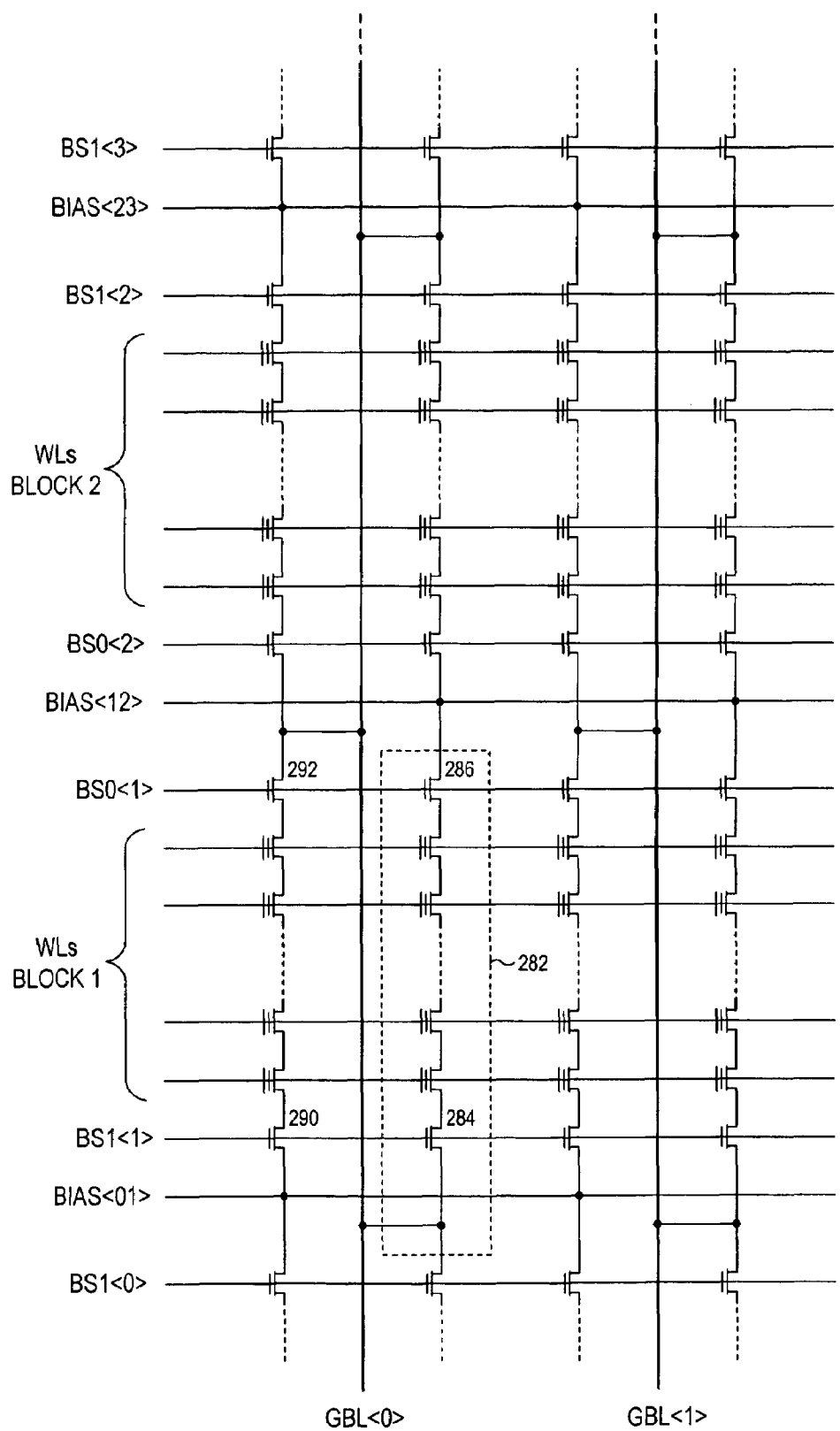
FIG. 9 depicts a portion of a mirrored NAND string memory array configuration.

Referring now to FIG. 9, a schematic diagram is depicted of a mirrored NAND string arrangement 280 in which two different NAND strings in each of two blocks are coupled to the same global bit line. Again, the portion shown may represent a two-dimensional array having only one plane of memory cells, or may represent one level of three-dimensional memory array having more than one plane of memory cells. Two global bit lines GBL<0> and GBL<1> are shown, and respective lines for two different memory blocks <1> and <2> are shown, as well as portions of other adjacent blocks.

Referring to an exemplary NAND string 282, one end of the NAND string is coupled to a global bit line GBL<0> by a select device 284 which is controlled by a block select signal BS1<1>, which signal may be thought of as a block select signal BS1 for memory block <1>. The other end of the NAND string 282 is coupled to a shared bias node BIAS<12> by select device 286 which is controlled by a block select signal BS0<1>, which signal may be thought of as a block select signal BS0 for memory block <1>. The shared bias node BIAS<12> is shared by memory block <1> and memory block <2>.

As stated above, adjacent NAND strings at least share the same word lines, and in this arrangement are coupled to the same global bit line (although by respectively different block select signals) but do not share the same shared bias node (i.e., shared "drain" node). The upper end of an adjacent NAND string (e.g., just to the left of NAND string 282) is coupled to the global bit line GBL<0> by select device 292 which is controlled by the block select signal BS0<1>. The lower end of this adjacent NAND string is coupled to a shared bias node BIAS<01> by select device 290 which is controlled by the block select signal BS1<1>.

In an adjacent memory block <2>, a block select signal BS1<2> respectively couples one end of two adjacent NAND strings to an associated global bit line (e.g., GBL<1>) and to a shared bias line BIAS<23>, and another block select signal BS0<2> respectively couples the other end of the two adjacent NAND strings to a shared bias line BIAS<12> and an associated global bit line. Block select signals BS1<0> and BS1<3> are also shown for clarity and form part of memory blocks <0> and <3>.

Additional description of this mirrored arrangement 280, including exemplary operating conditions for reading, programming, and erasing memory cells within such an array, may be found in "Method for Fabricating Programmable Memory Array Structures Incorporating Series-Connected Transistor Strings" by Andrew J. Walker, et al., and in "NAND Memory Array Incorporating Capacitance Boosting of Channel Regions in Unselected Memory Cells and Method for Operation of Same" by En-Hsing Chen, et al., both referred to above.

Figure 10:
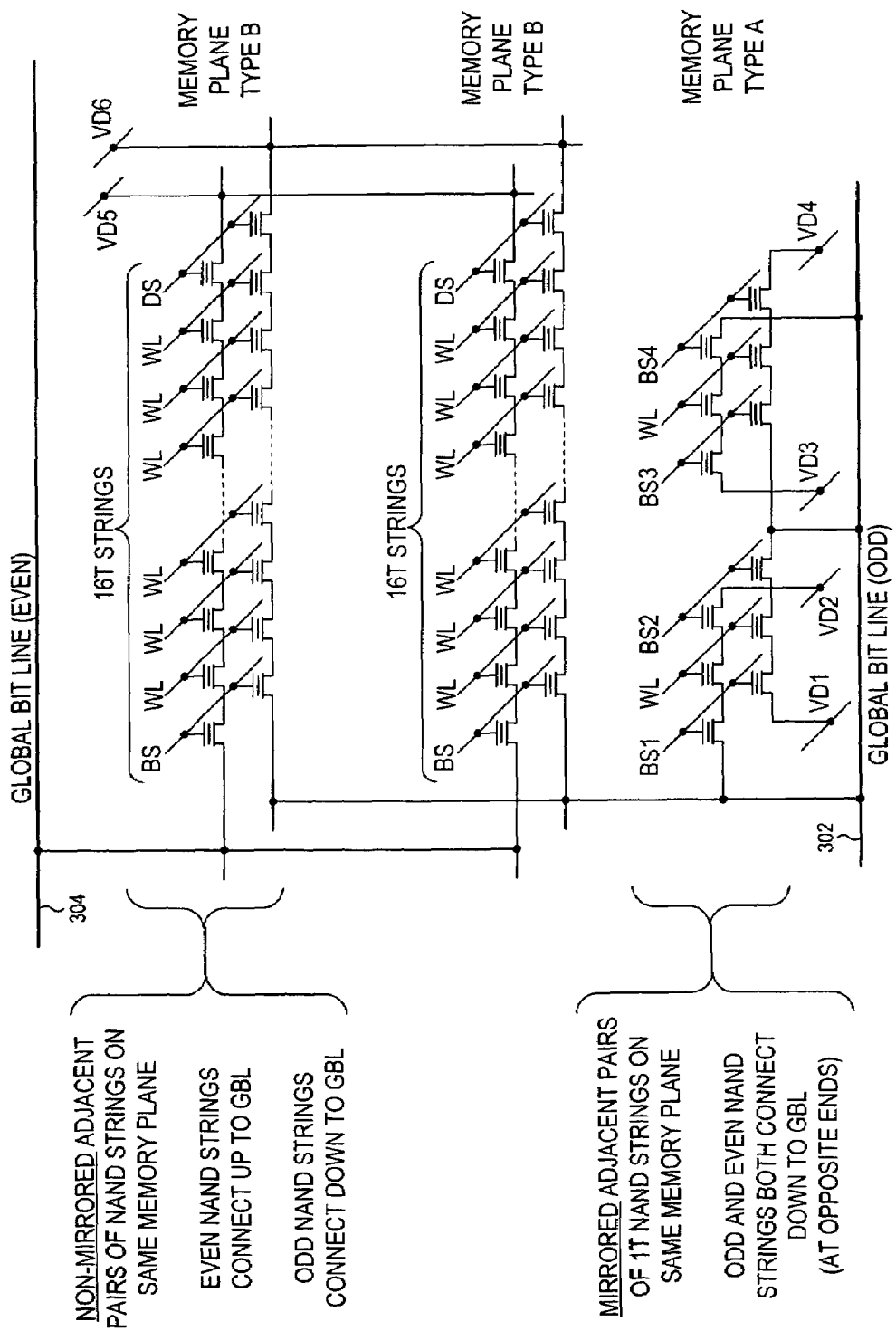
FIG. 10 depicts a portion of a NAND string memory array configuration in which a pair of mirrored 1T strings are disposed on one memory plane below a pair of non-mirrored longer NAND strings disposed on each of the upper memory planes. The even-numbered NAND strings on the upper planes are served by a global bit line layer disposed above the memory planes, while the odd-numbered NAND strings on the upper planes and the mirrored 1T strings are served by a global bit line layer below the memory planes.

Referring now to FIG. 10, a schematic diagram is depicted of a memory array 300 which incorporates two types of memory planes. Memory plane type A includes 1T NAND strings arranged in a mirrored configuration, each adjacent pair of NAND strings sharing a single global bit line 302 on a global bit line layer disposed below the memory planes. One or more than one such memory plane of type A may be implemented. A first pair of adjacent 1T NAND strings is associated with a word line WL and two block select signals BS1 and BS2. Opposite ends of these two NAND strings are coupled to the global bit line 302, and the other ends respectively coupled to bias nodes VD1 and VD2. A second pair of adjacent 1T NAND strings is associated with an associated word line WL and two block select signals BS3 and BS4. Opposite ends of these two NAND strings are coupled to the global bit line 302, and the other ends respectively coupled to bias nodes VD3 and VD4.

Memory plane type B includes longer (e.g., 16T) NAND strings arranged in a non-mirrored configuration, one of an adjacent pair of NAND strings coupled to the global bit line 302 on the global bit line layer disposed below the memory planes, and the other of the adjacent pair of NAND strings coupled to a global bit line 304 on a global bit line layer disposed above the memory planes. In other words, odd-numbered NAND strings are coupled to an associated global bit line on a first global bit line layer, and even-numbered NAND strings are coupled to an associated global bit line on a second global bit line layer. One or more than one such memory planes of type B may be implemented. On each such type B memory plane, a pair of adjacent 16T NAND strings is associated with 16 word lines WL and two block select signals BS and DS. The same ends of these two adjacent NAND strings are coupled respectively to its associated global bit line, and the other ends respectively coupled to bias nodes VD5 and VD6.

Since 1T NAND string exhibit far less disturb characteristics than longer strings, the shorter 1T strings may advantageously be arranged in a mirror configuration as shown, thus relaxing the required pitch of the global bit lines on the lower global bit line layer (i.e., one global bit line per every pair of adjacent NAND strings). The longer strings may be advantageously arranged in a non-mirrored configuration as shown to help control disturb characteristics of such memory cells. The relaxed global bit line pitch is maintained by coupling alternating adjacent NAND strings respectively to global bit lines on two different global bit line layers.

Referring now to FIG. 11, an exemplary two-dimensional memory array 340 is depicted in which a group of global bit lines 346 traverses across multiple blocks of 16T NAND strings 344 and also a single block of 1T NAND strings 342. Read/write circuitry 348 is common to both types of blocks. Many of the various embodiments described above may be implemented in accordance with FIG. 11, in which many blocks having NAND strings of one type, and fewer blocks (e.g., even just one block) having NAND strings of a second type, are both coupled to the same group of global bit lines and served by the same read/write circuitry.

Referring now to FIG. 12, a corresponding three-dimensional memory array 350 is depicted in which the group of global bit lines 346 traverses across multiple blocks 354 having 16T NAND strings disposed on more than one memory plane, and also a single block 352 having 1T NAND strings disposed on more than one memory plane. Read/write circuitry 348 is again common to both types of blocks. Many of the various embodiments described above may be implemented in accordance with FIG. 11 or FIG. 12, in which many blocks having NAND strings of one type, and fewer blocks (e.g., even just one block) having NAND strings of a second type, are both coupled to the same group of global bit lines and served by the same read/write circuitry.

Figure 13:
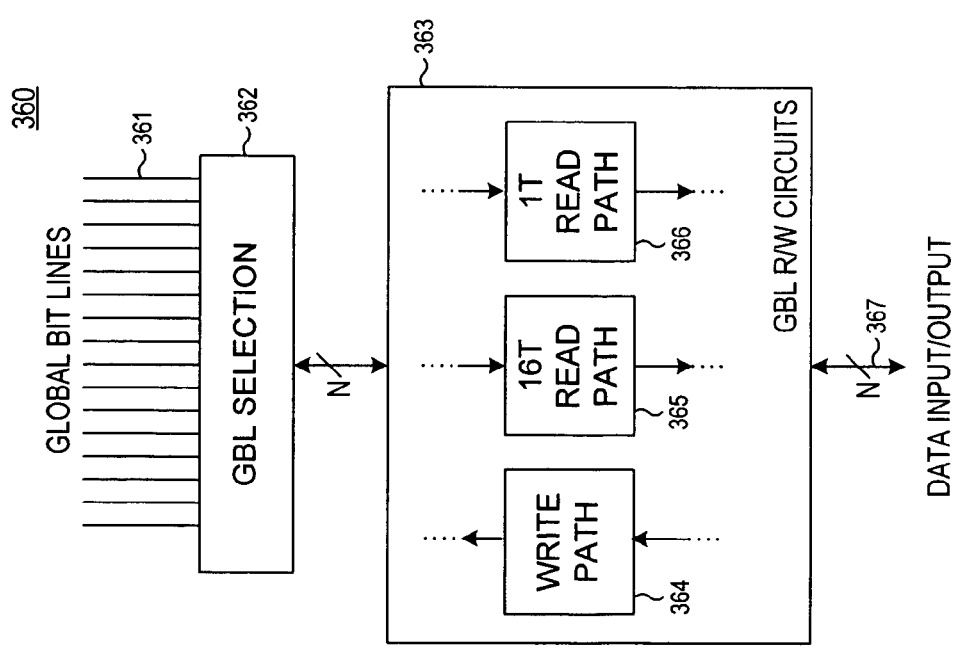
FIG. 13 is a block diagram representing a read/write block for a group of global bit lines having independent read paths for 16T and 1T blocks, and sharing a common write (i.e., programming) path.

However, it is not required that such read/write circuitry be shared between NAND strings of different types. Certain embodiments may dedicate global bit lines on one layer to NAND strings of one type, and global bit lines on another layer to NAND strings of a second type. Such different layers of global bit lines may utilize separate read and/or write circuitry to achieve desired results. Alternatively, other embodiments, even those having a single global bit line layer, may utilize different read and/or write paths. Referring now to FIG. 13, a block diagram is shown of a configuration 360 having separate read paths and a common write path. A group of global bit lines 361 is coupled to a GBL selection circuit 362 which selects one or more global bit lines during a read or write operation, and conveys up to N selected global bit lines to a R/W circuits block 363. A 1T read path 366 is enabled whenever the addressed memory cells are within a 1T block, and a 16T read path 365 is enabled whenever the addressed memory cells are within a 16T block. A common write block 364 is used for programming memory cells within either a 1T or 16T block. The data for writing to or reading from the selected N global bit lines is conveyed to or from the R/W block 363 by way of an N-bit bus 367.

Figure 14:
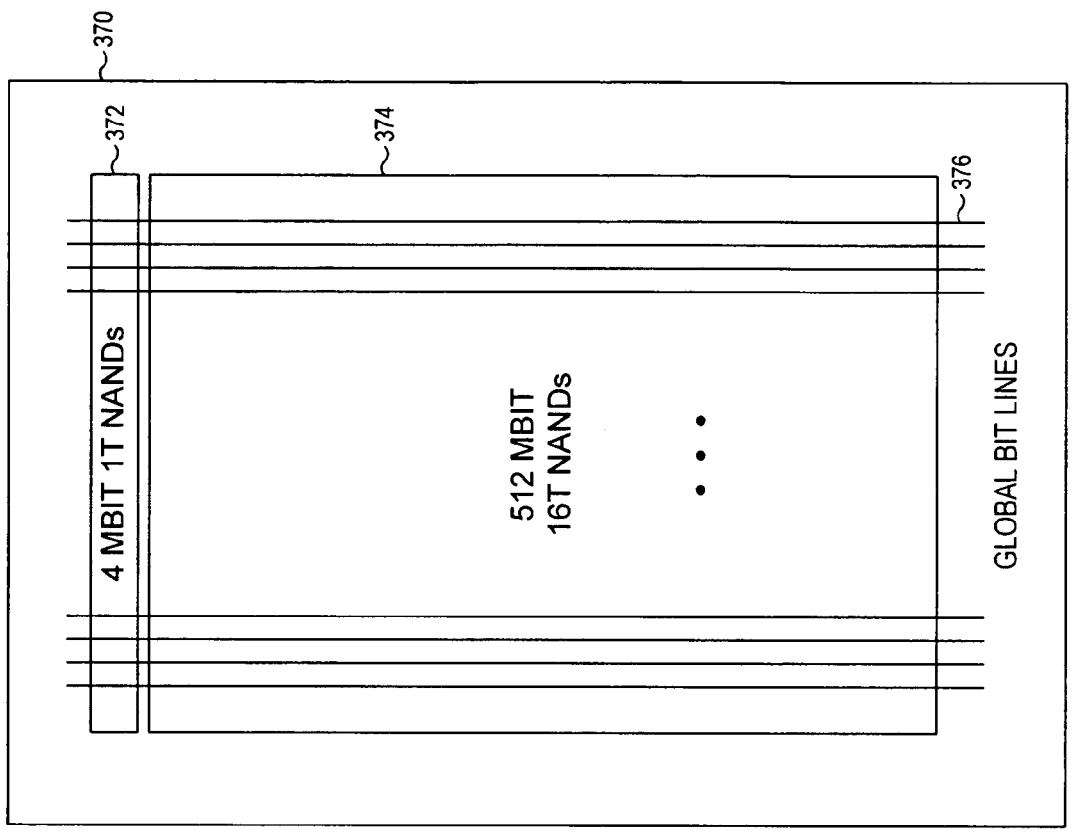
FIG. 14 depicts an integrated circuit NAND string memory array in which a large portion is implemented as 16T NAND strings, while a smaller portion is implemented as 1T NAND strings, and which a common group of global bit lines serves both portions.

Referring now to FIG. 14, an exemplary embodiment is depicted of an integrated circuit 370 including a three-dimensional memory array having a first portion 374 of 16T NAND string memory blocks totaling 512 MBits, and a second portion 372 of 1T NAND string memory blocks totaling 4 MBits, both served by a common group of global bit lines 376. The two portions 372, 374 may share global bit lines disposed on a single global bit line layer, preferably disposed below the memory planes and above localized interconnect layers, and moreover preferably shares most of the read and write circuitry. The 1T-strings provides erase blocks which are 1/16 the size, have 16 times less read disturb, have no $V_{PASS}$ (i.e., passing word line voltage) program disturb, and roughly more than 10 times the read current compared to the 16T string blocks. For example, the 16T strings may provide a read current of approximately 0.5uA, whereas the 1T strings may provide a read current of greater than 5uA. This allows for a greater number of reads without disturb effects and can provide faster read times.

In certain embodiments, a multi-level memory array includes memory cells formed on each of several memory planes or memory levels. NAND strings on more than one plane may be connected to global bit lines on a single global bit line layer. Such a global bit line layer is preferably disposed on a layer of a monolithic integrated circuit below all the memory levels for more convenient connection to support circuitry for the memory array, which may be disposed in the substrate below the array. In some embodiments such a global bit line layer may reside in the midst of the memory levels, or above the array, and more than one global bit line layer may be used. Moreover, the NAND strings on more than one layer may also be connected to shared bias nodes on a single layer, which may be disposed above all the memory planes, in the midst of the memory planes, or below the memory planes. The shared bias nodes may likewise be disposed on more than one layer.

Since the non-mirrored NAND string arrangement depicted utilizes a global bit line for each adjacent NAND string, the pitch of global bit lines may be tighter than for other embodiments in which adjacent NAND strings share the same global bit line. To alleviate global bit line pitch problems, in certain embodiments global bit lines may be routed on two or more wiring layers. For example, even-numbered NAND strings may be associated with global bit lines disposed on one global bit line layer, while odd-numbered NAND strings may be associated with global bit lines disposed on another global bit line layer. Vias may be staggered to help match the pitch of NAND strings, and the required global bit line pitch relaxed to twice the pitch of individual NAND strings. Vertical vias that contact more than two vertically adjacent layers may also be used, particularly for three-dimensional arrays having more than one memory plane of NAND strings. Such a vertical connection may also be conveniently termed a "zia" to imply a via-type structure connecting more than one layer in the z-direction. Preferred zia structures and related methods for their formation are described in U.S. Pat. No. 6,534,403 to Cleeves, issued Mar. 18, 2003, the disclosure of which is hereby incorporated by reference in its entirety. When global bit lines are routed on two or more wiring layers the vertical connection to the global bit lines may be advantageously made by "organ pipe zias" which connect memory lines down to wiring layers on more than one layer, as described in detail in U.S. patent application Ser. No. 10/728,451 by Roy E. Scheuerlein, et al.

Both mirrored and non-mirrored configurations, as described herein, are specifically contemplated. Additional contact sharing may be employed to further reduce the area required by any given block. For example, the contacts to the global bit lines in a non-mirrored configuration may be shared by two memory blocks, one on either side of the shared contacts. In addition, the shared drain line and its associated contacts to the end of NAND strings in one block may be shared by the NAND strings in the adjacent block. In other embodiments, adjacent blocks may have independent shared drain nodes to avoid stressing the unselected blocks.

Compact arrangements of zias may be formed in a variety of ways, including in a linear configuration and in a staggered configuration. Specific exemplary arrangements, structures and methods for their fabrication are described in "NAND Memory Array Incorporating Capacitance Boosting of Channel Regions in Unselected Memory Cells and Method for Operation of Same," by En-Hsing Chen, et al., already referred to above, particularly in FIGS. 17A, 17B, 17D, and 17E; U.S. patent application Ser. No. 10/728,451 by Roy E. Scheuerlein, et al., entitled "High Density Contact to Relaxed Geometry Layers," which application is hereby incorporated by reference in its entirety; and "Method for Fabricating Programmable Memory Array Structures Incorporating Series-Connected Transistor Strings," already referenced above, particularly in FIG. 24, FIG. 25, FIG. 28, and FIG. 29.

Various techniques described additionally in "NAND Memory Array Incorporating Capacitance Boosting of Channel Regions in Unselected Memory Cells and Method for Operation of Same," by En-Hsing Chen, et al., such as channel boosting, multiple programming pulses, multi-level pulses, and multiple series selection devices, may be used alone or in combination to reduce H-cell program disturb (i.e., disturb of a non-selected memory cell sharing the selected word line), F-cell program disturb (i.e., disturb of a non-selected memory cell in the selected NAND string), and to provide for robust S-cell programming (i.e., the selected memory cell in the selected NAND string coupled to the selected word line).

For a non-mirrored configuration, some embodiments use a single selection device on the "top end" of each string (i.e., the global bit line end), and two series selection devices on the "bottom end" of each NAND string (i.e., the bias node end), with two independent gate voltages for the bottom select group. Multi-level gate pulses may also be used. Preferred programming conditions are described in greater detail in "NAND Memory Array Incorporating Capacitance Boosting of Channel Regions in Unselected Memory Cells and Method for Operation of Same," by En-Hsing Chen, et al., referred to above.

In certain embodiments, the shared drain line may be common for all memory blocks. In other embodiments, this common node (also described herein as a global source line for non-mirrored configurations) may be split into multiple nodes, and each independently biased, as further described in "NAND Memory Array Incorporating Capacitance Boosting of Channel Regions in Unselected Memory Cells and Method for Operation of Same" by En-Hsing Chen, et al.

As described above, for many memory arrays, and especially for a three-dimensional (3D) memory, utilizing depletion mode devices when erased and near depletion mode devices (i.e., around one volt VT, such as, for example, 0.5 to 1.5V) when programmed has a great advantage in simplifying the layout complexity for each of the memory layers. Moreover, utilizing near depletion mode devices when programmed reduces the voltages that need to be applied to the unselected word lines when reading a selected memory cell. The cell current can pass more easily through the string even if unselected memory cells are programmed. This voltage reduction is beneficial for reducing disturb effects during the many expected read cycles. For example, an unselected memory cell on an unselected NAND string which is erased could be slowly disturbed to a programmed state by higher voltages on the word lines. Nonetheless, suitable embodiments may incorporate NAND strings in which both of the memory states corresponds to enhancement mode operation (i.e., $V_T > 0$).

Figure 15:
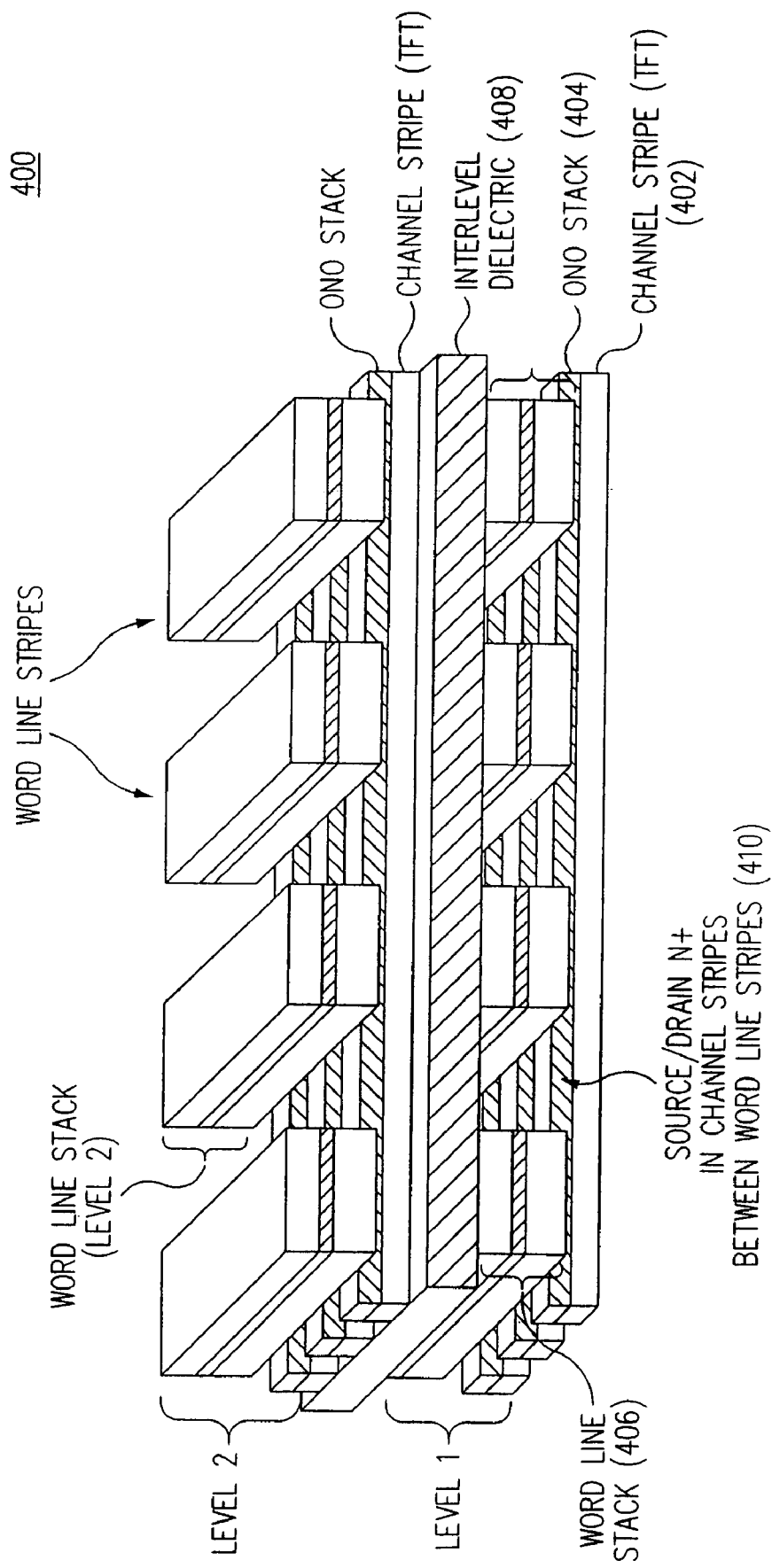
FIG. 15 is a perspective view of a multi-level array structure useful for embodiments of the present invention, showing series-connected NAND strings of SONOS memory cell devices.

NAND strings in accordance with the present invention may be fabricated using any of a number of different processes. An integrated circuit may include a memory array having a single memory plane, or may include a memory array having more than one memory plane. One exemplary structure is depicted in FIG. 15. A three-dimensional view is shown conceptually depicting a portion of a two-level memory array 400 (i.e., two memory planes). On level 1, a plurality of channel stripes (e.g., 402) is formed in a first direction. A stored charge dielectric layer 404, such as an oxide/nitride/oxide (ONO) stack, is formed at least on the top surface of the channel stripes 402. A plurality of gate stripes (e.g., 406) running in a second direction different than the first direction is formed on the stored charge dielectric layer 404. Preferably the gate stripes, also called word line stripes, run generally orthogonally to the channel stripes. A source/drain region (e.g., 410) is formed in the channel stripes in the exposed regions between the word line stripes (i.e., not covered by a word line stripe), thus forming a series-connected string of thin-film transistors (TFT).

Such channel stripes 402 are preferably formed by depositing an amorphous silicon layer and etching the layer using a channel mask to form the channel stripes and annealing the layer to form a thin film transistor channel. The word line stripes may be formed of a stack of more than one layer, such as a polysilicon layer covered by a silicide layer, or may be a three level word line stack 406, as shown in the figure.

An interlayer dielectric layer 408 is formed above the word line stripes to isolate the word lines on one level (e.g., word line stripes 406 depicted on level 1) from the channel stripes on the next higher level (e.g., channel stripes 402 depicted on level 2). A dielectric may also be used to fill spaces between the word line stripes of a given level. As can be appreciated, such a structure forms a plurality of series-connected transistors within each channel stripe 402.

The transistors of such a NAND string may be fabricated to contain enhancement or depletion mode devices for the erased state. In other types of NAND memory arrays using floating gate devices (rather than SONOS devices), the erased state may be a zero-volt threshold voltage ($V_T$) or even a depletion mode $V_T$. A floating gate device can have a wide range of $V_T$'s because the floating gate can store a wide range of charge levels. Such a depletion mode programmed state is described in "A Negative Vth Cell Architecture for Highly Scalable, Excellently Noise-Immune, and Highly Reliable NAND Flash Memories" by Takeuchi et al., in IEEE JSSC, Vol. 34, No. 5, May 1999, pp. 675–684.

In exemplary configurations, a selected NAND string is generally read by impressing a voltage across the NAND string, ensuring that both groups of one or more block select devices are biased to pass a current, ensuring that all non-selected memory cell devices in the NAND string are biased to pass a current through the string irrespective of the data state stored therein, and biasing the selected word line so that current flows through the NAND string for only one of the two data states. All the memory cells in a selected block may be erased by impressing a sufficiently high magnitude negative gate-to-source voltage across each memory cell transistor. For example, the global bit lines, any shared bias nodes, all block select lines, and all word lines may be driven to an erase ($V_{EE}$) voltage of, for example, 10 volts. After allowing time for the intermediate nodes in the selected block to charge to substantially the erase voltage conveyed on the global bit lines and shared drain nodes, the word lines in the selected block are brought to ground to impress an erase bias across each memory cell in the block. Additional details of both reading and erasing NAND string configurations are described in "Programmable Memory Array Structure Incorporating Series-Connected Transistor Strings and Methods for Fabrication and Operation of Same," by Roy E. Scheuerlein, et al, already referenced above, and in "NAND Memory Array Incorporating Capacitance Boosting of Channel Regions in Unselected Memory Cells and Method for Operation of Same," by En-Hsing Chen, et al., also already referenced above.

One or more of the block select devices in embodiments described herein may be biased at times with a negative gate-to-source voltage. This puts a partial erase bias on such a block select device. If these block select devices are formed by the same process steps as a programmable cell, such as a depletion mode SONOS cell, these block select devices can get partially "erased" by this bias voltage applied during programming of a selected memory cell, which would slowly decrease the $V_T$ of the block select devices into a negative region after a number of program cycles. Such a threshold voltage may prevent the block select device from being turned off.

In some embodiments one could use extra processing to remove the charge storage dielectric layer (e.g., nitride) from the block select devices, or to fabricate another type of select device different than the memory cell device, but this adds additional complexity to the semiconductor process. Alternatively, a post-programming biasing condition is preferably added at the end of each program cycle, where the affected block select device is "programmed" a small amount to bring its $V_T$ back up to its maximum of, for example, about 0 volts. This may be accomplished by returning all the word lines in a selected block back to ground (0 volts), taking the global bit lines and shared drain nodes (or global source node) to ground, and driving the respective select signal to the programming voltage for a short time. For convenience, all the block select signals may be driven to the programming voltage as there is little concern for over-programming the threshold of the block select devices. For an exemplary SONOS process, the erase time is much longer than the programming time, so that even a relatively short (e.g., 1 μs) "block select $V_T$ adjust program time" is adequate to ensure that its $V_T$ stays at its maximum.

Figure 16:
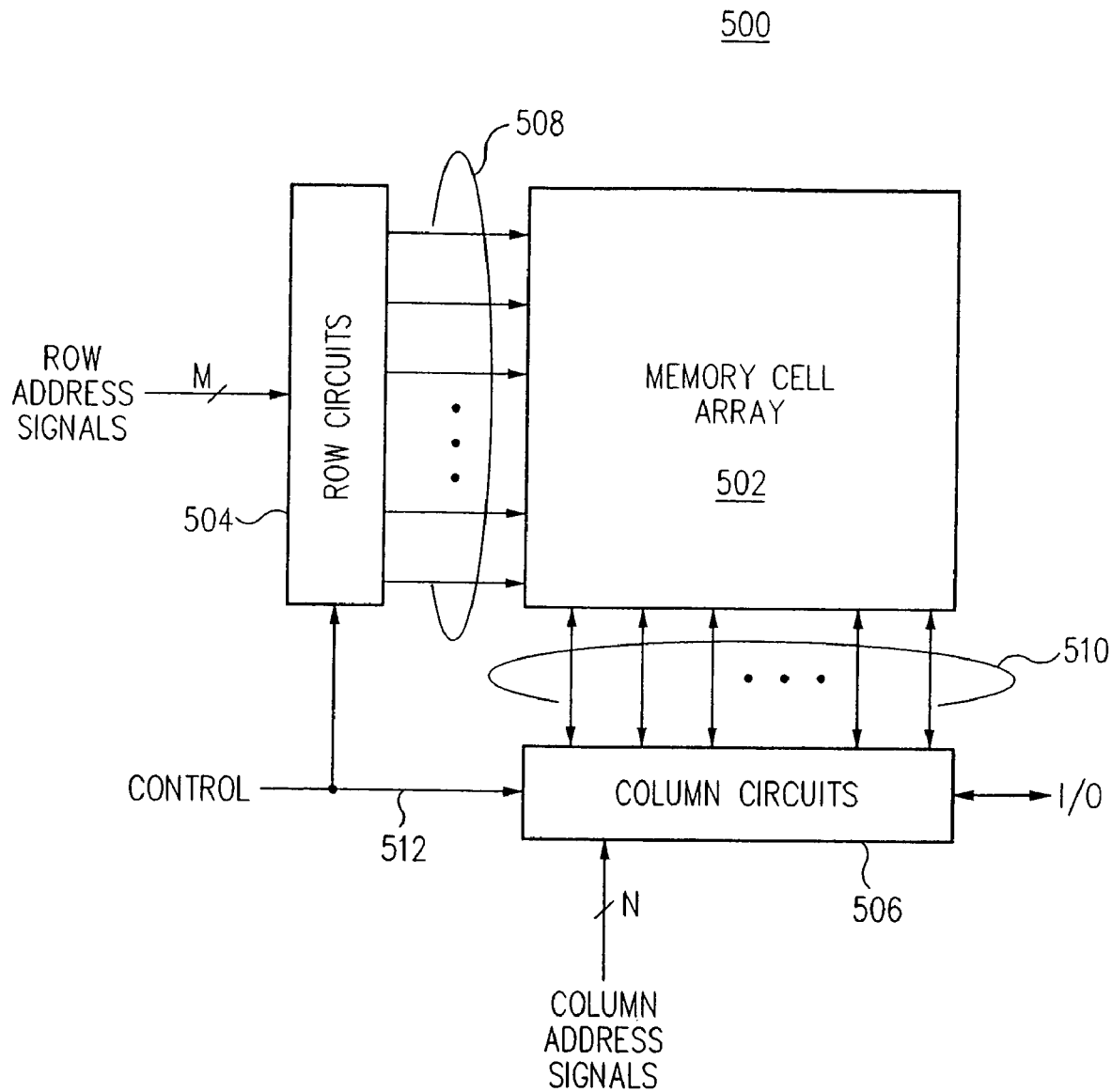
FIG. 16 is a block diagram of an integrated circuit incorporating a memory array in accordance with the present invention.

Referring now to FIG. 16, a block diagram is shown of an integrated circuit 500 including a memory array 502, which diagram may be useful to represent various embodiments of the present invention. In one such embodiment, the memory array 502 is preferably a three-dimensional, field-programmable, non-volatile memory array having more than one plane (or level) of memory cells.

The integrated circuit 500 includes a row circuits block 504 whose outputs 508 are connected to respective word lines of the memory array 502. The row circuits block 504 receives a group of M row address signals, various control signals 512, and typically may include such circuits as row decoders and array terminal drivers for both read and write (i.e., programming) operations. The row circuit block can also include circuits for controlling the block select lines and shared drain bias lines to determine block selection by some of the M row address signals. The integrated circuit 500 also includes a column circuits block 506 whose input/outputs 510 are connected to respective global bit lines of the memory array 502. The column circuits block 506 receives a group of N column address signals, various control signals 512, and typically may include such circuits as column decoders, array terminal receivers, read/write circuitry, and I/O multiplexers. Circuits such as the row circuits block 504 and the column circuits block 506 may be collectively termed array terminal circuits for their connection to the various terminals of the memory array 502.

While any of a variety of semiconductor processes may be advantageously utilized to fabricate memory arrays having NAND strings, many embodiments described above contemplate memory cells formed as thin film transistors above a semiconductor substrate. Preferred methods for fabricating such memory arrays are described in: U.S. application Ser. No. 10/334,649 filed on Dec. 31, 2002, by Andrew J. Walker, et al., entitled "Formation of Thin Channels for TFT Devices to Ensure Low Variability of Threshold Voltages," which application is hereby incorporated by reference; U.S. application Ser. No. 10/079,472 filed on Feb. 19, 2002, by Maitreyee Mahajani, et al., entitled "Gate Dielectric Structures for Integrated Circuits and Methods for Making and Using Such Gate Dielectric Structures," which application is hereby incorporated by reference; U.S. application Ser. No. 10/335,089 by Andrew J. Walker, et al, entitled "Method for Fabricating Programmable Memory Array Structures Incorporating Series-Connected Transistor Strings," filed on Dec. 31, 2002, which application is hereby incorporated by reference in its entirety; U.S. application Ser. No. 10/668,693 by Maitreyee Mahajani, et al, entitled "Storage Layer Optimization of a Non Volatile Memory Device," filed on Sep. 23, 2003, which application is hereby incorporated by reference in its entirety; U.S. patent application Ser. No. 10/728,437 by James M. Cleeves, et al., entitled "Optimization of Critical Dimensions and Pitch of Patterned Features In and Above a Substrate," filed on Dec. 5, 2003, which application is hereby incorporated by reference in its entirety; and U.S. patent application Ser. No. 10/728,436, by Yung-Tin Chen, entitled "Photomask Features with Interior Nonprinting Window Using Alternating Phase Shifting," filed on Dec. 5, 2003, which application is hereby incorporated by reference in its entirety.

As used herein, a series-connected NAND string includes a plurality of devices connected in series and sharing source/drain diffusions between adjacent devices. As used herein, a memory array may be a two dimensional (planar) memory array having a memory level formed in a substrate, or alternatively formed above the substrate. The substrate may either be a monocrystalline substrate, such as might include support circuitry for the memory array, or may be another type of substrate, which need not necessarily include support circuitry for the memory array. For example, certain embodiments of the invention may be implemented utilizing a silicon-on-insulator (SOI) structure, and others utilizing a silicon-on-sapphire (SOS) structure. Alternatively, a memory array may be a three-dimensional array having more than one plane of memory cells. The memory planes may be formed above a substrate including support circuitry for the memory array. As used herein, an integrated circuit having a three-dimensional memory array is assumed to be a monolithic integrated circuit, rather than an assembly of more than one monolithic integrated circuit packaged together or in close proximity, or die-bonded together.

Integrated circuits incorporating a memory array usually subdivide the array into a sometimes large number of smaller arrays, also sometimes known as sub-arrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays.

The present invention is contemplated for advantageous use with any of a wide variety of memory array configurations, including both traditional single-level memory arrays and multi-level (i.e., three-dimensional) memory arrays, and particularly those having extremely dense X-line or Y-line pitch requirements. Moreover, the invention is believed to be applicable to memory array having series-connected NAND strings which utilize modifiable conductance switch devices as memory cells, and is not to be limited to memory cells incorporating a charge storage dielectric. Such modifiable conductance switch devices are three-terminal devices whose conductance between two of the terminals is modifiable, and further is "switched" or controlled by a signal on the third or control terminal, which is generally connected to the word lines (or to the block select lines, for some embodiments). The conductance may be modified post-manufacture (i.e., by programming using a tunneling current; by programming using a hot electron current, etc). The modifiable conductance frequently is manifested as a modifiable threshold voltage, but may be manifested as a modifiable transconductance for some technologies.

Another exemplary memory array may implement NAND strings of "polarizable dielectric devices" such as Ferroelectric devices, where the device characteristics are modified by applying a voltage on the gate electrode which changes the polarization state of the Ferroelectric gate material. Another exemplary memory array may implement NAND strings of programmable devices utilizing a floating gate, where the device characteristics are modified by applying a voltage on a control gate electrode which causes charge to be stored onto the floating gate, thereby changing the effective threshold voltage of the device. Yet another exemplary memory array may implement NAND strings of so-called "single electron" devices or "coulomb blockade" devices, where applied voltages on the word line change the state of electron traps formed by silicon nanoparticles or any quantum well structure in the channel region by which the conduction characteristics of the NAND string devices are changed. In some embodiments, the structure of the charge storage region of the NAND string devices could also be located in a nanometer sized (i.e., from 0.1 to 10 nanometers) silicon filament formed at the source or drain edges of the gate structure to modify the device characteristic. Other alternative embodiments may utilize an organic conducting layer for the channel region and form organic material devices in a NAND string whose conductive state is selectively changed by applying an appropriate voltage to the word lines.

Thus, while the embodiments described in detail above utilize charge storage dielectric such as an ONO stack, other memory cells such as a floating gate EEPROM programmed threshold devices, polarizable dielectric devices, single electron or coulomb blockade devices, silicon filament charge storage devices, and organic material devices are also contemplated. Moreover, the invention may also be utilized to provide more than one bit per memory cell. For example, multiple bits of information could be stored by injecting several different levels of charge into the charge storage medium and associating different charge levels with different stored states.

In many of the embodiments described above, the block select devices are formed using the same process flow as the memory cells to reduce the number of process steps and device structures fabricated at each memory level. Thus the block select devices are formed having the same structure as the memory cells, although they may be sized differently. As used herein, such block select devices may be considered to be structurally substantially identical to the memory cell devices, even though the respective threshold voltages may be programmed or erased to different values.

It should also be appreciated that the designations top, left, bottom, and right are merely convenient descriptive terms for the four sides of a memory array. The word lines for a block may be implemented as two inter-digitated groups of word lines oriented horizontally, and the global bit lines for a block may be implemented as two inter-digitated groups of global bit lines oriented vertically. Each respective group of word lines or global bit lines may be served by a respective decoder/driver circuit and a respective sense circuit on one of the four sides of the array. Suitable row and column circuits are set forth in "Multi-Headed Decoder Structure Utilizing Memory Array Line Driver with Dual Purpose Driver Device," U.S. patent application Ser. No. 10/306,887, filed Nov. 27, 2002; in "Tree Decoder Structure Particularly Well Suited to Interfacing Array Lines Having Extremely Small Layout Pitch," U.S. patent application Ser. No. 10/306,888, filed Nov. 27, 2002; in "Apparatus and Method for Hierarchical Decoding of Dense Memory Arrays Using Multiple Levels of Multiple-Headed Decoders," by Luca G. Fasoli and Kenneth K. So, U.S. application Ser. No. 11/026,470 filed on even date herewith; and in "Dual-Mode Decoder Circuit, Integrated Circuit Memory Array Incorporating Same, and Related Methods of Operation" by Kenneth K. So, Luca G. Fasoli and Roy E. Scheuerlein, U.S. application Ser. No. 11/026,493 filed on even date herewith, which applications are hereby incorporated by reference in their entirety. The global bit line may be driven by a bit line driver circuit, which may be either directly coupled to the global bit line or may be shared among several global bit lines and coupled by decoding circuitry to a desired global bit line.

As used herein, word lines and bit lines (e.g., including global bit lines) usually represent orthogonal array lines, and follow the common assumption in the art that word lines are driven and bit lines are sensed, at least during a read operation. Thus, the global bit lines of an array may also be referred to as sense lines of the array, and may also be referred to as simply global array lines (i.e., even though other array lines also exist). No particular implication should be drawn as to word organization by use of such terms. Moreover, as used herein, a "global bit line" is an array line that connects to NAND strings in more than one memory block, but no particular inference should be drawn suggesting such a global bit line must traverse across an entire memory array or substantially across an entire integrated circuit. As used herein, a "block select device," an "access device" and a mere "select device" are all used interchangeably, and consequently a "block select signal," an "access signal" and a mere "select signal" are also all used interchangeably. As used herein, "coupled" may be used to indicate either directly coupled (i.e., no intervening nodes, devices, or structures) or indirectly coupled.

It will be appreciated by one skilled in the art that any of several expressions may be equally well used when describing the operation of a circuit including the various signals and nodes within the circuit, and no subtle inferences should be read into varied usage within this description. Frequently logic signals are named in a fashion to convey which level is the active level. The schematic diagrams and accompanying description of the signals and nodes should in context be clear. As use herein, two different voltages which are "substantially equal" to each other have respective values which are close enough to cause substantially the same effect under the context at issue. Such voltages may be assumed to fall within approximately 0.5 volts of each other, unless the context requires another value.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. Similarly, the number of array blocks and the number of memory planes are also a matter of engineering decision. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. In particular, even though many embodiments are described in the context of a three-dimensional memory array of TFT memory cells, such limitations should not be read into the claims unless specifically recited. Moreover, the embodiments described above are specifically contemplated to be used alone as well as in various combinations. Accordingly, other embodiments, variations, and improvements not described herein are not necessarily excluded from the scope of the invention.

What is claimed is:

1. A monolithic integrated circuit comprising a memory array, said memory array comprising first and second groups of NAND strings, each NAND string comprising at least two series-connected devices and coupled at one end thereof to an associated global array line, wherein NAND strings of the first group differ in at least one physical characteristic from NAND strings of the second group, wherein NAND strings of both the first and second group are disposed in a region of the memory array traversed by a plurality of global array lines, and wherein the second group of NAND strings are configured to store configuration data hidden during normal operation of the integrated circuit.

2. The integrated circuit as recited in claim 1 wherein the physical characteristic comprises drive strength, and NAND strings of the first group have a different drive strength than NAND strings of the second group.

3. The integrated circuit as recited in claim 1 wherein each NAND string comprises a group of one or more memory cell devices in series with at least one select device.

4. The integrated circuit as recited in claim 1 wherein the physical characteristic comprises the respective number of series-connected devices forming the respective NAND string, and wherein NAND strings of the first group have a larger number of series-connected devices than NAND strings of the second group.

5. The integrated circuit of claim 1 embodied in computer readable descriptive form suitable for use in design, test or fabrication of the integrated circuit.

6. A monolithic integrated circuit comprising a memory array, said memory array comprising first and second groups of NAND strings, each NAND string comprising at least two series-connected devices and coupled at one end thereof to an associated global array line, wherein NAND strings of the first group differ in at least one physical characteristic from NAND strings of the second group, wherein NAND strings of both the first and second group are disposed in a region of the memory array traversed by a plurality of global array lines, wherein the physical characteristic comprises the respective number of series-connected devices forming the respective NAND string, and wherein NAND strings of the first group have a larger number of series-connected devices than NAND strings of the second group, and wherein:

the memory array comprises a three-dimensional memory array having more than one memory plane; and at least some of the NAND strings of the first group are disposed on at least a first memory plane; and at least some of the NAND strings of the second group are disposed on at least a second memory plane different than the first memory plane.

7. The integrated circuit as recited in claim 6 further comprising write circuitry shared by both NAND strings of the first and second groups.

8. The integrated circuit as recited in claim 7 further comprising read circuitry shared by both NAND strings of the first and second groups.

9. The integrated circuit as recited in claim 6 wherein:

each NAND string comprises a group of one or more memory cell devices in series with at least one select device;

NAND strings on more than one memory plane share global array lines; and at least some of the NAND strings of both the first and second groups share global array lines.

10. The integrated circuit as recited in claim 9 wherein:

memory cells of at least the first or second group comprise a charge storage dielectric.

11. The integrated circuit as recited in claim 9 wherein NAND strings of the second group each includes at most two memory cell devices and a single select device at each end thereof.

12. The integrated circuit as recited in claim 9 wherein the select devices and the memory cell devices of both first and second groups comprise thin film devices having a charge storage dielectric.

13. The integrated circuit as recited in claim 9 wherein the second group of NAND strings are configured to store configuration data hidden during normal operation of the integrated circuit.

14. The integrated circuit as recited in claim 13 wherein the configuration data comprises redundancy information for the memory array.

15. The integrated circuit as recited in claim 9 wherein the memory array further comprises NAND strings of a third group having a different number of series-connected devices than the first and second groups of NAND strings.

16. The integrated circuit as recited in claim 9 comprising NAND strings of the second group disposed laterally displaced from NAND strings of the first group.

17. The integrated circuit as recited in claim 16 wherein:

NAND strings of the first group are disposed on more than one plane;

NAND strings of the second group are disposed on more than one plane; and

NAND strings of both the first and second groups share global array lines.

18. The integrated circuit as recited in claim 9 comprising on a first memory plane NAND strings of the first group which are disposed above or below NAND strings of the second group on a second memory plane.

19. The integrated circuit as recited in claim 18 wherein NAND strings of the second group are disposed on one or more memory planes closest to a substrate of the integrated circuit.

20. The integrated circuit as recited in claim 18 comprising on the second memory plane more than one NAND string of the second group disposed in the same region generally corresponding to a single NAND string of the first group on the first memory plane.

21. The integrated circuit as recited in claim 20 comprising an odd number of NAND strings of the second group disposed in the same region corresponding to a single NAND string of the first group, said odd number of NAND strings being generally in-line and coupled together to define a respective common node connecting each such NAND string, said respective common nodes alternately coupled to a vertical global array line connection and a vertical bias node connection.

22. The integrated circuit as recited in claim 18 wherein the memory array comprises:

a first set of contiguous memory planes comprising NAND strings of the first group; and a second set of contiguous memory planes comprising NAND strings of the second group; and a first group of vertical connections, each respectively connecting at least one NAND string on each memory plane to a respective global array line on a first global array line layer.

23. The integrated circuit as recited in claim 22 wherein NAND strings of the second group each consists of a single memory cell device and a single select device at each end thereof.

24. The integrated circuit as recited in claim 22 further comprising a second group of vertical connections, each respectively connecting at least one NAND string on each memory plane of the second set to a respective global array line on the first global array line layer, without connecting to any NAND string on memory planes of the first set.

25. The integrated circuit as recited in claim 22 wherein, on each memory plane of the first and second sets, both NAND strings of an adjacent pair of NAND strings are respectively coupled at the same end thereof to a respective associated global array line on the first global array line layer.

26. The integrated circuit as recited in claim 22 further comprising:

a third group of vertical connections, each respectively connecting at least one NAND string on each memory plane of the first set to a respective global array line on a second global array line layer different than the first global array line layer.

27. The integrated circuit as recited in claim 26 wherein:

for an adjacent pair of NAND strings on a memory plane of the first set, one NAND string of the adjacent pair is associated with a global array line on the first global array line layer, and the other NAND string of the adjacent pair is associated with a global array line on the second global array line layer.

28. The integrated circuit as recited in claim 27 wherein: for an adjacent pair of NAND strings on a memory plane of the second set, one NAND string of the adjacent pair is coupled at one end thereof, and the other NAND string of the adjacent pair is coupled at the opposite end thereof, both to one associated global array line on the first global array line layer.

29. The integrated circuit of claim 6 embodied in computer readable descriptive form suitable for use in design, test or fabrication of the integrated circuit.

* * * * *